US012635425B2

(12) United States Patent
Miyazoe et al.

(10) Patent No.: US 12,635,425 B2
(45) Date of Patent: May 19, 2026

(54) STACKED CONDUCTIVE BRIDGE RANDOM ACCESS MEMORY AND ACCESS DEVICES

(71) Applicant: International Business Machines Corporation, Armonk, NY (US)

(72) Inventors: Hiroyuki Miyazoe, White Plains, NY (US); Gloria Wing Yun Fraczak, Bayside, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 643 days.

(21) Appl. No.: 17/554,510

(22) Filed: Dec. 17, 2021

(65) Prior Publication Data

US 2023/0200269 A1 Jun. 22, 2023

(51) Int. Cl.
| | |
|---|---|
| *H10N 70/00* | (2023.01) |
| *H10B 63/00* | (2023.01) |

(52) U.S. Cl.
CPC ........... *H10N 70/826* (2023.02); *H10B 63/84* (2023.02); *H10N 70/021* (2023.02); *H10N 70/063* (2023.02); *H10N 70/066* (2023.02); *H10N 70/068* (2023.02); *H10N 70/841* (2023.02); *H10N 70/883* (2023.02)

(58) Field of Classification Search
CPC .... H10B 63/84; H10N 70/068; H10N 70/063; H10N 70/841; H10N 70/021; H10N 70/883; H10N 70/066; H10N 70/826
USPC ........................................................ 365/148
See application file for complete search history.

(56) References Cited

U.S. PATENT DOCUMENTS

| | | | |
|---|---|---|---|
| 8,830,725 B2 | 9/2014 | Bethune et al. | |
| 9,691,975 B2* | 6/2017 | Goux | G11C 13/0011 |
| 9,773,978 B1 | 9/2017 | Fraczak et al. | |
| 10,854,675 B2 | 12/2020 | Sciarrillo | |
| 10,886,467 B2 | 1/2021 | Miyazoe et al. | |
| 10,903,270 B2 | 1/2021 | Bruce et al. | |
| 2011/0227023 A1 | 9/2011 | Bethune et al. | |
| 2018/0040819 A1 | 2/2018 | Fraczak et al. | |
| 2019/0115392 A1* | 4/2019 | Bruce | H10B 63/84 |
| 2020/0136038 A1* | 4/2020 | Manfrini | H10N 70/20 |
| 2020/0161372 A1* | 5/2020 | Beckmann | H10N 70/063 |
| 2020/0350499 A1* | 11/2020 | Miyazoe | H10N 70/063 |
| 2021/0273159 A1* | 9/2021 | Lin | H10B 63/00 |
| 2021/0359203 A1* | 11/2021 | Hsieh | H10N 70/881 |
| 2021/0391250 A1* | 12/2021 | Lian | H10W 20/42 |

(Continued)

OTHER PUBLICATIONS

K. Gopalakrishnan et al., "Highly-Scalable Novel Access Device Based on Mixed Ionic Electronic Conduction (MIEC) Materials for High Density Phase Change Memory (PCM) Arrays," IEEE Symposium on VLSI Technology, Jun. 2010, pp. 205-206.

(Continued)

*Primary Examiner* — Sung Il Cho
(74) *Attorney, Agent, or Firm* — L. Jeffrey Kelly; Ryan, Mason & Lewis, LLP

(57) ABSTRACT

A semiconductor structure comprises a conductive bridge random access memory device and an access device connected in series with the conductive bridge random access memory device. The conductive bridge random access memory device and the access device are arranged in a vertical stack. The vertical stack has a sidewall profile that increases in width from a bottom surface of the vertical stack to a top surface of the vertical stack.

19 Claims, 20 Drawing Sheets

100

TOP ELECTRODES
107

JUNCTIONS WITH RESISTIVELY SWITCHING MATERIAL
105

SUBSTRATE
101

BOTTOM ELECTRODES
103

(56)         References Cited

U.S. PATENT DOCUMENTS

2022/0230680 A1*    7/2022   Wu ..................... G11C 11/5678
2022/0416158 A1*   12/2022   Loy ........................ H10B 63/80

OTHER PUBLICATIONS

A. S. Sokolov et al., "Towards Engineering in Memristors for Emerging Memory and Neuromorphic Computing: A Review," Journal of Semiconductors, vol. 42, No. 1, 2021, pp. 1-29.
X.-X. Xu et al., "Resistive Switching Memory for High Density Storage and Computing," Chinese Physics B, vol. 30, No., 5, 2021, pp. 058702-1-058702-26.
H.-S. P. Wong et al., "Metal-Oxide RRAM," Proceedings of the IEEE, vol. 100, No. 6, Jun. 2012, pp. 1951-1970.
R. Waser, "Integration of TiO2 into Nano-Crossbar Arrays with 100 nm Half Pitch for Resisitve RAM Applications," http://www.emrl. de/r_a_1.html, Accessed Oct. 18, 2021, 11 pages.
T. Gokem et al., "Acceleration of Deep Neural Network Training with Resistive Cross-Point Devices: Design 6 Considerations," Frontiers in Neuroscience, vol. 10, No. 333, Jul. 2016, 13 pages.

* cited by examiner

TOP ELECTRODES 107

JUNCTIONS WITH RESISTIVELY SWITCHING MATERIAL 105

SUBSTRATE 101

BOTTOM ELECTRODES 103

250

200

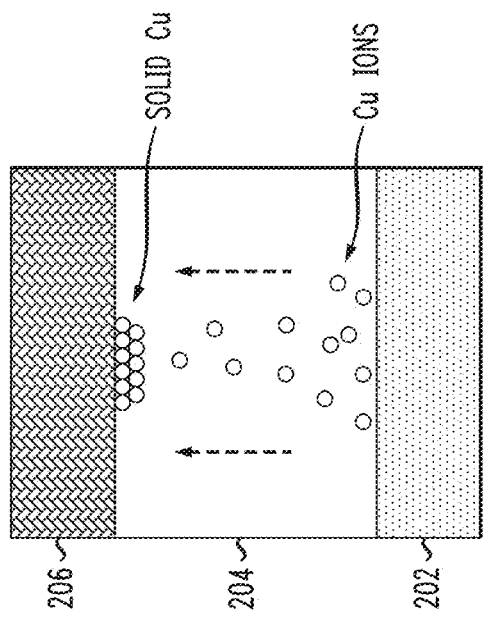
SOLID Cu
Cu IONS
206
204
202
*FIG. 2C*
CYCLE 1
275
−V
+V
206
204
202
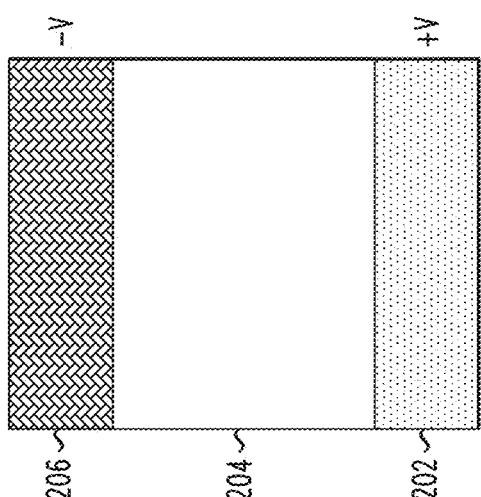

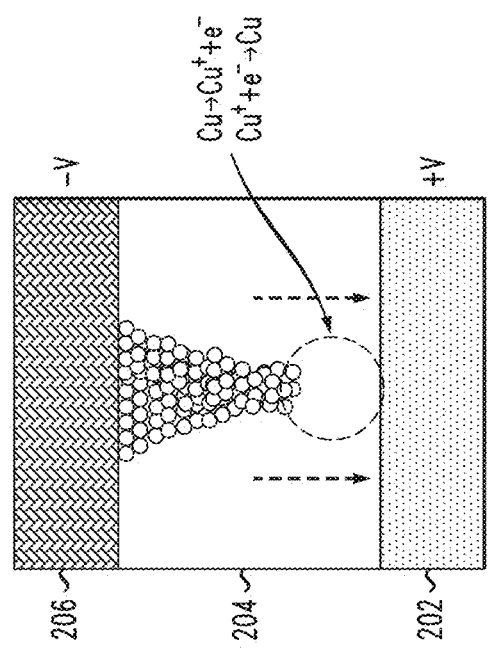
$Cu \rightarrow Cu^+ + e^-$
$Cu^+ + e^- \rightarrow Cu$
*FIG. 2D*
CYCLE 2
285
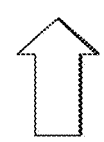
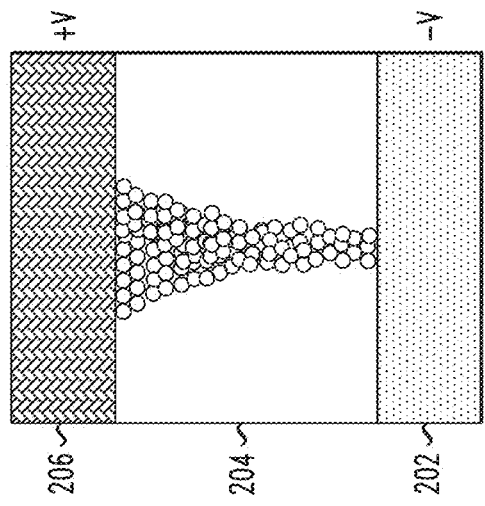

350

300

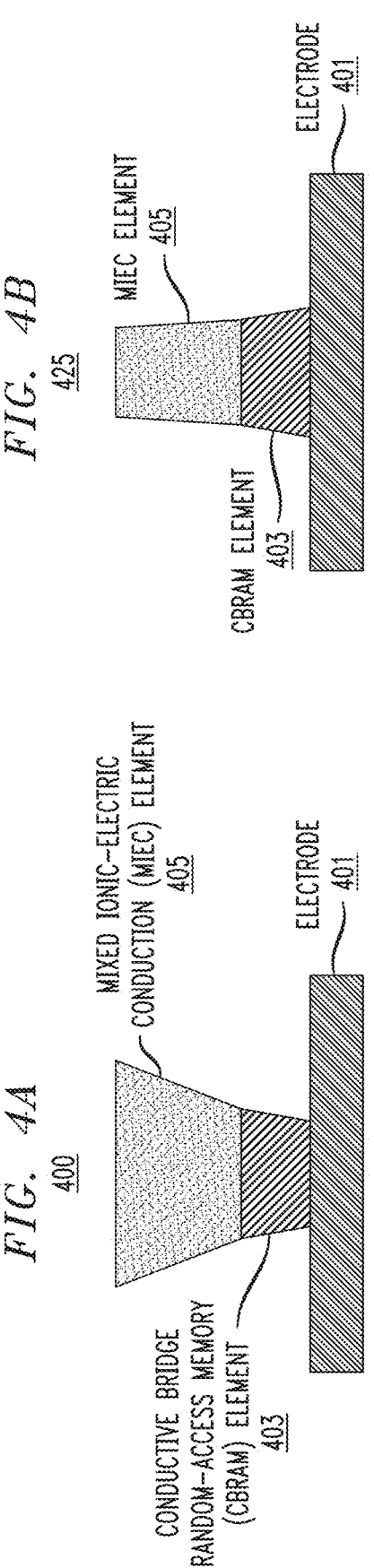
*FIG. 4A*
400
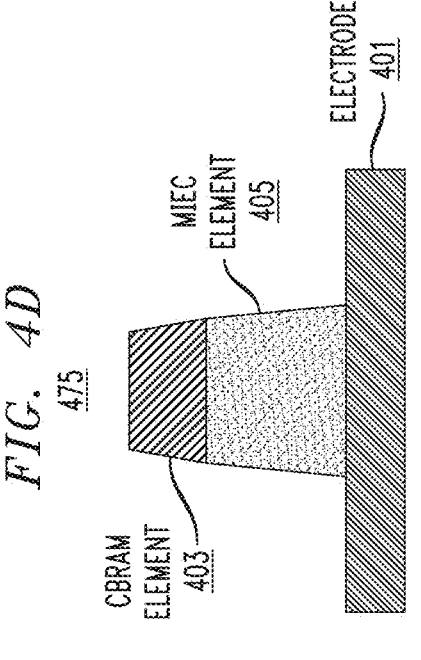
*FIG. 4B*
425
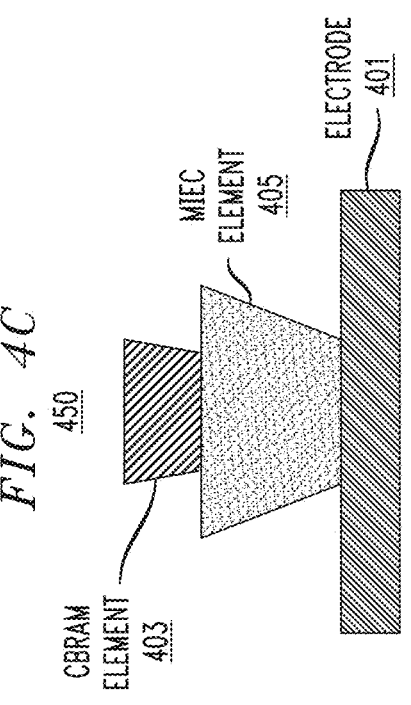
*FIG. 4C*
450
*FIG. 4D*
475

525

THICK FILM 511

POLISHED FILM 513

POST-ETCH 515

500

OVERFILLED TRENCH 501

PLANARIZED TRENCH 503

600-1

600-2

600-3

<u>600-4</u>

<u>600-5</u>

600-6

600-7

600-8

600-9

600-12

600-13

700-1

700-2

700-3

Y
X ←→ X'
Y'

700-4

720
718
712
710
708
714
716
704
702
706

Y
X ←→ X'
Y'

700-5

720
718
712
710
708
714
716
704
702
706

700-6

700-7

700-10

700-11

700-12

700-13

700-14

STACKED CONDUCTIVE BRIDGE RANDOM ACCESS MEMORY AND ACCESS DEVICES

BACKGROUND

The present application relates to semiconductors, and more specifically, to techniques for forming cross-bar arrays. Arrays of trainable resistive crosspoint devices may be used to provide a cross-bar array. The trainable resistive crosspoint devices, or resistive processing units, may be used in a wide variety of application areas, including performing machine learning computations in an analog domain.

SUMMARY

Embodiments of the invention provide techniques for forming vertical stacks of conductive bridge random access memory devices and access devices connected in series with the conductive bridge random access memory devices utilizing subtractive etching.

In one embodiment, a semiconductor structure comprises a conductive bridge random access memory device and an access device connected in series with the conductive bridge random access memory device. The conductive bridge random access memory device and the access device are arranged in a vertical stack. The vertical stack has a sidewall profile that increases in width from a bottom surface of the vertical stack to a top surface of the vertical stack.

In one embodiment, an integrated circuit comprises a crossbar array structure comprising a plurality of crosspoint devices each coupled at a first end to one of a plurality of conductive row wires and at a second end to one of a plurality of conductive column wires. A given one of the plurality of crosspoint devices comprises a vertical stack of a conductive bridge random access memory device and an access device connected in series with the conductive bridge random access memory device, the vertical stack having a sidewall profile that increases in width from a bottom surface of the vertical stack to a top surface of the vertical stack.

In another embodiment, a method comprises forming a vertical stack comprising a conductive bridge random access memory device and an access device connected in series with the conductive bridge random access memory device, and patterning the vertical stack utilizing a subtractive etching process to form a patterned vertical stack having a sidewall profile that increases in width from a bottom surface of the patterned vertical stack to a top surface of the patterned vertical stack.

These and other features and advantages of embodiments described herein will become more apparent from the accompanying drawings and the following detailed description.

BRIEF DESCRIPTION OF THE DRAWINGS

FIG. 1 depicts a perspective view of a crossbar array comprising conductive bridge random access memory elements, according to an embodiment of the invention.

FIGS. 2A-2D depict a structure and operation of a conductive bridge random access memory element, according to an embodiment of the invention.

FIGS. 4A-4D depict structures with stacked access devices and conductive bridge random access memory elements, according to an embodiment of the invention.

DETAILED DESCRIPTION

Figures 2A, 2B:
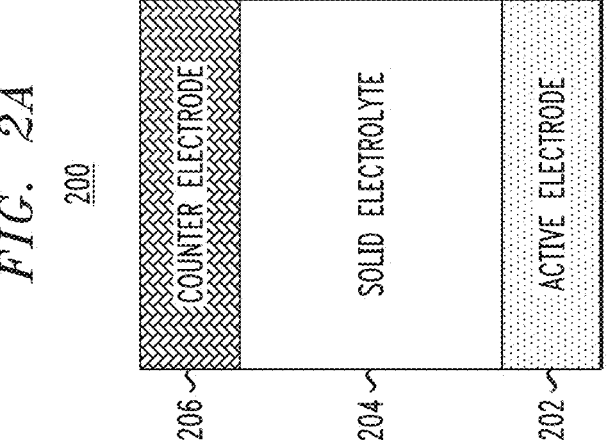

Illustrative embodiments of the invention may be described herein in the context of illustrative methods for forming vertically stacked structures including a conductive bridge random access memory device connected in series with an access device, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Neural networks may be used to implement machine learning and inference for cognitive computing. While neural networks can be implemented at a software level, neural networks implemented in hardware are more efficient. For example, a neural network may be implemented in hardware through a cross-bar implementation with the crosspoint devices having variable resistance used to represent weight values. Such crosspoint devices are also referred to herein as resistive processing units (RPUs).

Machine learning is a term used herein to broadly describe a function of electronic systems that learn from data. In machine learning and cognitive science, artificial neural networks (ANNs) are a family of statistical learning models. ANNs are inspired by biological neural networks of animals (e.g., the brain). ANNs may be used to estimate or approximate various systems and functions that depend on a large number of inputs, particularly where inputs are generally unknown.

ANNs may be embodied as "neuromorphic" systems of interconnected processor elements that act as simulated neurons and exchange messages between each other in the form of electronic signals. Similar to the so-called plasticity of synaptic neurotransmitter connections that carry messages between biological neurons, connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition may be defined by a set of input neurons, which may be activated by pixels of an input image. After being weighted and transformed by a function determined by a designer of the ANN, the activations of the input neurons are passed to other downstream neurons, often referred to as hidden neurons. This process is repeated until an output neuron is activated, with the activated output neuron determining which character was read.

Crossbar arrays, also referred to as crosspoint arrays or crosswire arrays, are high density and low cost circuit architectures used to form a variety of electronic circuits and devices, including but not limited to ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices.

Figure 1:
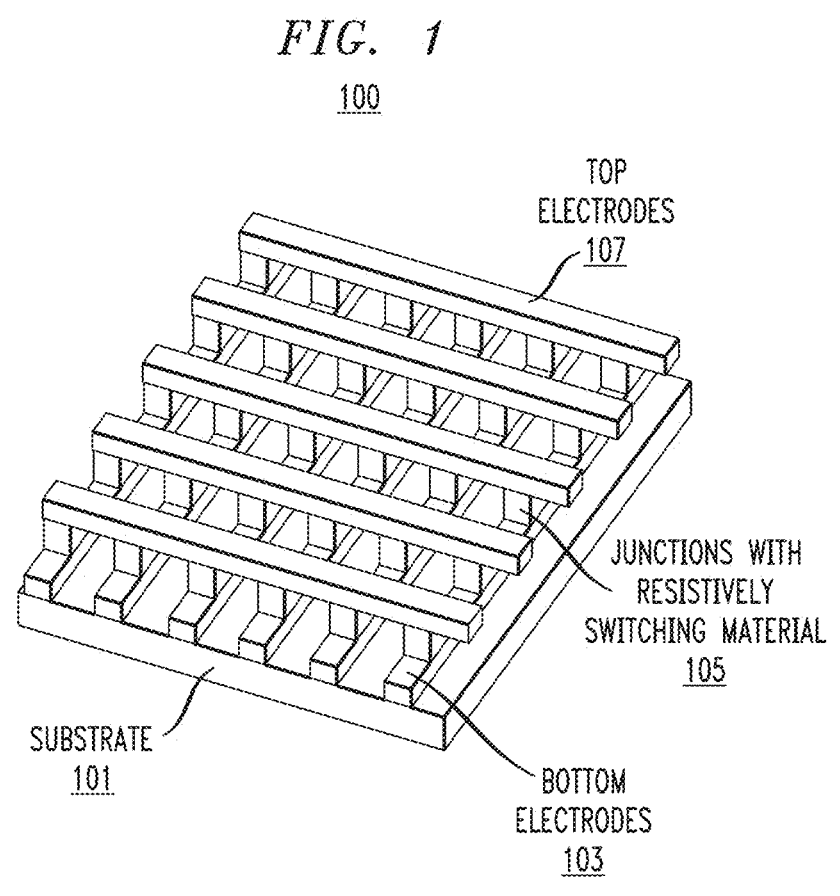

FIG. 1 shows an example of such a crossbar array 100, which includes a substrate 101, bottom electrodes 103, crosspoint devices 105 (e.g., junctions with resistively switching material, such as conductive bridge random access memory (CBRAM) elements or devices), and top electrodes 107. The bottom electrodes 103 and top electrodes 107 provide the conductive row and column wires for the crossbar array 100.

Crosspoint devices, in effect, function as an ANN's weighted connections between neurons. Each crosspoint device is a two-terminal device that emulates synaptic plasticity. The conduction state (e.g., resistance) of the crosspoint devices may be altered by controlling voltages applied between individual wires of the row and column wires (e.g., between the bottom electrodes 103 and the top electrodes 107 in the FIG. 1 example). Digital data may be stored by alteration of the conduction state at the crosspoint devices in the crossbar array.

A neural network may use back propagation for learning, which involves a forward pass, a backward pass and a weight update. In the forward pass, the input of each layer is multiplied with a weight matrix and fed to an activation function. The output becomes the input of the next layer until the last layer is reached. The error, with respect to an ideal output, is then calculated through a loss function. In the backward pass, the network error of the last layer is propagated back to calculate the error of each previous layer. This may be done recursively by computing a local gradient for each neuron. The local gradients are then used to perform each weight update.

Various types of devices may be used as crosspoint devices, including but not limited to electrically erasable programmable read-only memory (EEPROM), complementary metal-oxide-semiconductor (CMOS) devices, etc. CBRAM is a promising technology for electronic synapse devices or memristor devices used for neuromorphic computing, as well as for high-density and high-speed non-volatile memory (NVM) applications. In neuromorphic computing applications, for example, CBRAM devices may be used as connections (e.g., synapses) between pre-neurons and post-neurons, representing the connection weights in the form of the CBRAM device resistances. Multiple pre-neurons and post-neurons can be connected through a crossbar array of CBRAM devices, which naturally expresses a fully-connected neural network.

FIGS. 2A-2D depict a structure and operation of a CBRAM device. FIG. 2A shows a cross-sectional view 200 of the CBRAM device, which includes an active electrode 202, a solid electrolyte 204, and a counter electrode 206. The active electrode 202 may comprise copper (Cu), silver (Ag), combinations thereof, or another suitable material. The solid electrolyte 204 may comprise silicon dioxide $(SiO_2)$, silicon germanium (SiGe), silicon (Si), germanium (Ge), copper sulfide (CuS), germanium sulfide $(Ge_xS_y)$, germanium selenide $(Ge_xSe_y)$, or another suitable material. The counter electrode 206 may comprise tungsten (W), platinum (Pt), nickel (Ni), tungsten-titanium (TiW), titanium nitride (TiN), tantalum nitride (TaN), or another suitable material.

CBRAM has a simple geometry, but complicated reduction and oxidation reactions. FIG. 2B shows a plot 250, illustrating current and voltage for set and reset operations for the CBRAM device shown in FIG. 2A. The set operation causes the CBRAM device to enter its high resistance state (HRS), and the reset operation causes the CBRAM device to enter its low resistance state (LRS). FIGS. 2C and 2D respectively illustrate a first cycle 275 and a second cycle 285 for the set and reset operations of the CBRAM device. As shown in FIG. 2C, the CBRAM device starts in its HRS (e.g., a logic 1) and then a positive voltage (+V) is applied to the active electrode 202 while a negative voltage (−V) is applied to the counter electrode 206. Here, it is assumed that the active electrode 202 comprises Cu, and this causes a reaction $Cu^+ + e^- \rightarrow Cu$, where Cu ions move upward in the solid electrolyte 204 to form solid Cu proximate the counter electrode 206. This process continues, as shown in FIG. 2D, until a conductive filament is formed in the solid electrolyte 204 between the active electrode 202 and the counter electrode 206 and the CBRAM element is in its LRS (e.g., a logic 0). To reset the CBRAM element to the HRS (e.g., a logic 1), the voltages on the active electrode 202 and counter electrode 206 are reversed causing the conductive filament to "break" due to the $Cu \rightarrow Cu^+ + e^-$ reaction as shown.

Figure 3B:
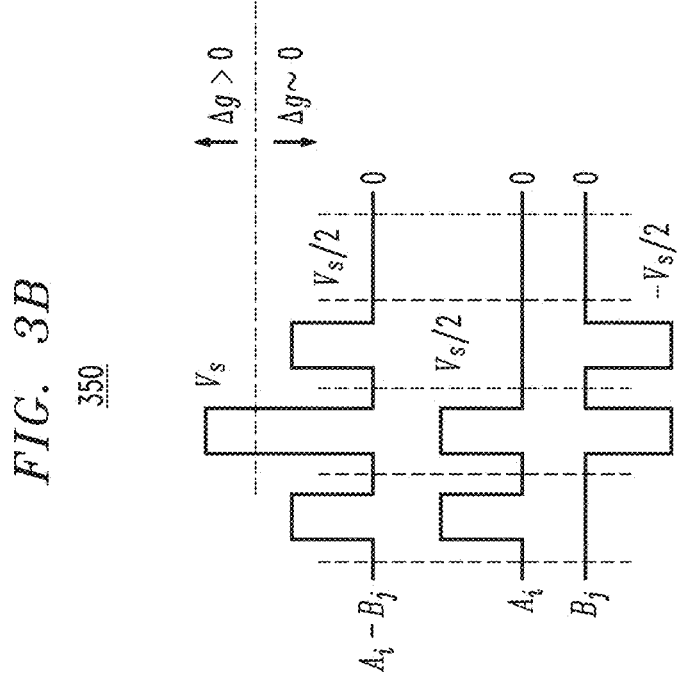
FIGS. 3A and 3B depict a structure and operation of a resistive processing unit implemented using a conductive bridge random access memory element, according to an embodiment of the invention.
Figure 3A:
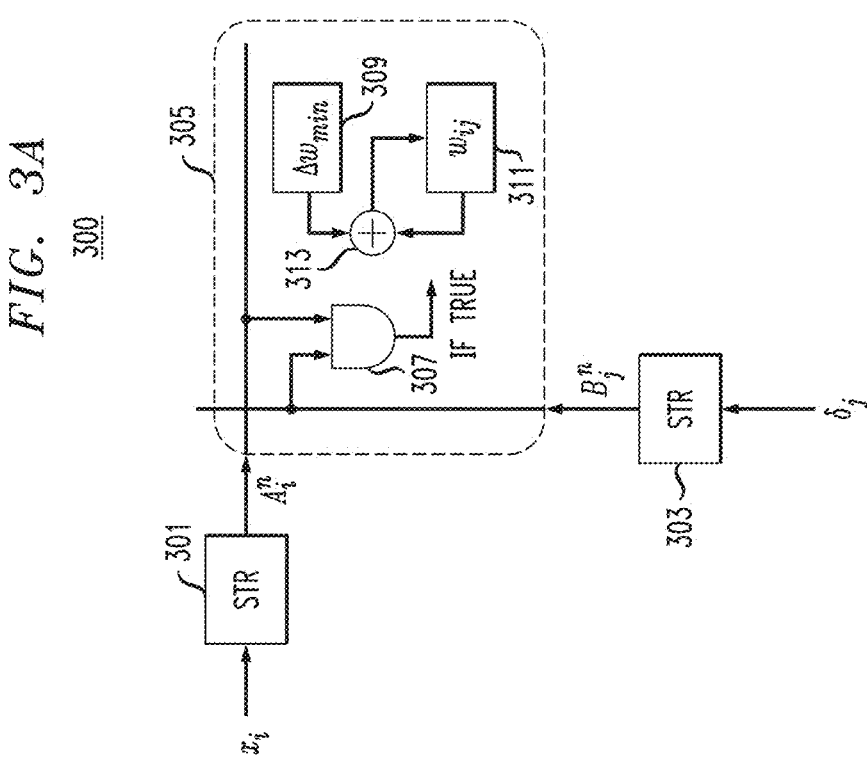

In some embodiments, CBRAM devices are combined with access devices to form RPUs that further enhance the functionality of neuromorphic computing. FIGS. 3A and 3B show a structure of an RPU 300 and operation 350 thereof, respectively. The RPU 300 illustratively utilizes a stochastic weight update where positive and negative voltage pulses with a magnitude of half of the switching voltage $(V_s)$ are applied. As shown in FIG. 3B, the coincidence events are distinguished if the memory element does not change states when $V_s/2$ is applied. The RPU 300, as shown in FIG. 3A, uses a stochastic update where numbers are encoded from neurons, denoted $x_i$ and $\delta_j$, are translated to stochastic bit streams $$A_i^n$$

and $$B_j^n$$

via respective stochastic translator (STR) elements 301 and 303. Such bit streams are provided to the crossbar array element 305, where the crossbar array element 305 changes its conductance ($g_{ij}$) when bits from $x_i$ and $\delta_j$ coincide (e.g., as illustrated in FIG. 3B). This is represented by a logical AND operation 307, which if true enables an update $\Delta w_{min}$ 309 to the weight $w_{ij}$ 311 of the crossbar array element 305 via adder 313.

Illustrative embodiments provide a novel structure of a stack of a CBRAM device and an access device (AD). The stack of the CBRAM device and the AD in some embodiments is formed using a single patterning step. The CBRAM device may have the structure described above with respect to FIG. 2 (e.g., where the active electrode 202 is Cu, Ag or a combination thereof, where the solid electrolyte 204 is SiO₂, SiGe, Si, Ge, CuS, Ge$_x$S$_y$, Ge$_x$S$_y$ or a combination thereof, and wherein the counter electrode 206 is W, Pt, Ni, TiW, TiN, TaN or a combination thereof). The AD may comprise a mixed electronic-ionic conduction (MIEC) based bi-polar current source. The MIEC may comprise, for example, copper germanium sulfide (Cu$_x$Ge$_y$S$_z$) or another suitable material. The CBRAM device and AD are stacked on top of one another (e.g., with the CBRAM device formed over the AD or the AD formed over the CBRAM device) in a back-end-of-line (BEOL) region. The stack of the CBRAM device and the AD has a straight sidewall profile, or a sidewall profile that is smaller on the top and larger at the bottom (e.g., a taper angle where the width at the top surface is less than the width at the bottom surface). Advantageously, the stacked CBRAM device and AD electronically meet the following criteria: half select voltage ($V_s$/2) <AD threshold voltage<sense voltage<CBRAM device switching threshold<full select voltage ($V_s$). Such criteria are met using the set of materials described above and elsewhere herein, and advantageously enable minimization of half-select errors in CBRAM devices with an AD (e.g., an MIEC diode) connected in series thereto.

For CBRAM devices, the device resistance does not depend much on the applied voltage after filament formation. Therefore, half selected devices (e.g., $V_s$/2) still experience approximately half of the leakage current that goes through selected devices (e.g., $V_s$). This adds up to large currents for the entire crossbar array, and limits the size of the array. Further, this also significantly contributes to the power consumption of the crossbar array. Access devices, such as field-effect transistors (FETs), may be used to suppress sneak path currents through unselected devices. This is useful when serial operations of individual CBRAM devices are performed, such as electro-forming steps. Damascene-based patterning of a stacked CBRAM device and AD structure is complex, as the CBRAM device and the AD (e.g., MIEC) need to be patterned separately. This does not help in reducing the leakage currents through half selected devices during parallel operations (e.g., multiply-accumulate operations, stochastic weight updates, etc.).

Illustrative embodiments provide techniques for forming a combination of a CBRAM device or element and an AD, which meets the above described relationships (e.g., half select voltage ($V_s$/2)<AD threshold voltage<sense voltage<CBRAM device switching threshold<full select voltage ($V_s$)). The AD threshold voltage and the CBRAM device switching threshold need to be sufficiently separated to have a voltage window for sensing. In some embodiments, materials are selected for the CBRAM device and the AD to provide such a voltage window. For example, the CBRAM device may use materials such as Si, SiGe, SiO$_x$, HfO$_x$ based conductive bridge memory using Cu or Ag as the active electrode, providing a typical switching threshold of 1-2 volts (V). The AD materials may include MIEC (e.g., Cu$_x$Ge$_y$S$_z$) with $I_g$<10 nanoamperes (nA) at 0.6V. The CBRAM device and AD may be stacked using a single patterning step, which is advantageous for density scaling and process simplicity.

FIGS. 4A-4D show respective cross-sectional views 400, 425, 450 and 475 of stacked structures including an electrode 401, a CBRAM element or device 403, and an MIEC element 405 providing an AD. The cross-sectional view 400 of FIG. 4A illustrates use of separate damascene-based patterning of the CBRAM element 403 and the MIEC element 405, resulting in angled sidewalls that taper such that the widths at the top surfaces (e.g., of both the CBRAM element 403 and the MIEC element 405) are greater than at the bottom surfaces. The cross-sectional view 425 of FIG. 4B, in contrast, illustrates straight sidewall profiles achieved when forming the CBRAM element 403 and the MIEC element 405 using subtractive etch processing. It should be noted that the sidewalls are not necessarily perfectly straight (e.g., a 90 degree angle), but may also be tapered but with an opposite taper angle than the structure shown in FIG. 4A (e.g., the widths of the CBRAM element 403 and the MIEC element 405 in the FIG. 4B structure are smaller at their top surfaces than their bottom surfaces). Advantageously, the CBRAM element 403 and MIEC element 405 may have substantially straight sidewalls (e.g., a sidewall angle of about 80 degrees or greater). The cross-sectional views 450 and 475 of FIGS. 4C and 4D similarly illustrate the differences in sidewall profiles for damascene-based and subtractive etch processing, but where the CBRAM element 403 is formed above rather than below the MIEC element 405 as in the structures of FIGS. 4A and 4B.

Figure 5B:
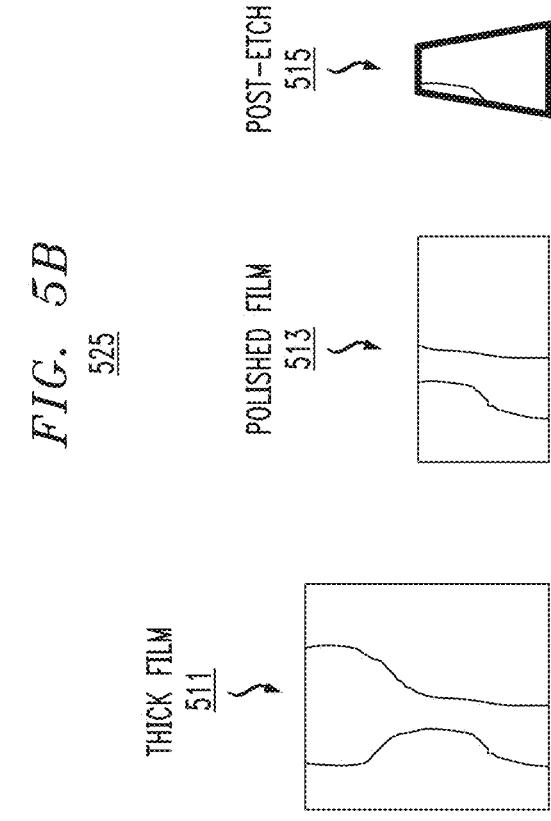
FIGS. 5A and 5B depict grains of films formed using damascene and subtractive etch processing, according to an embodiment of the invention.
Figure 5A:
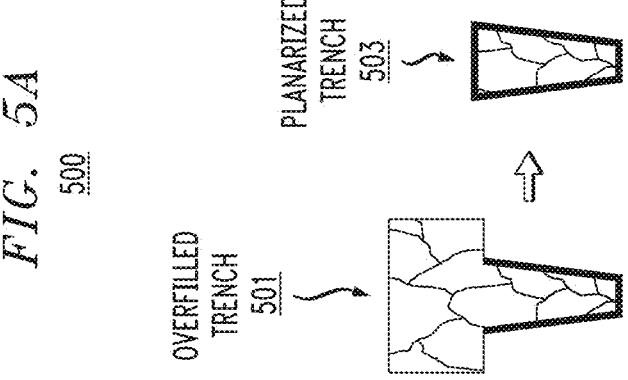

FIGS. 5A and 5B illustrate respective views 500 and 525 illustrating the differences in grain size and boundaries when forming films with damascene-based and subtractive etch processing. As shown in the view 500 of FIG. 5A, damascene processing results in smaller grains at the base of the trench, leading to more electron scattering at the grain boundary. This is due in part as a result of the smaller critical dimension (CD) (e.g., width or diameter) at the bottom of the trench. The trench may initially be overfilled 501, followed by planarization (e.g., using chemical mechanical planarization (CMP)) to result in the planarized trench 503. The view 525 of FIG. 5B, in contrast, depicts a subtractive etch process where a thick film 511 is initially formed, followed by planarization or polishing (e.g., using CMP) to result in polished film 513, which is then subject to etching to result in the post-etch film 515. The thick film 511 advantageously has large crystal grains, such that after polishing and etching there are fewer grain boundaries in the post-etch film 515 (e.g., relative to the planarized trench 503 of FIG. 5A).

FIGS. 6A-6M depict process flows for forming a stack of a CBRAM device and an AD, where the AD is formed over the CBRAM device.

Figure 6A:
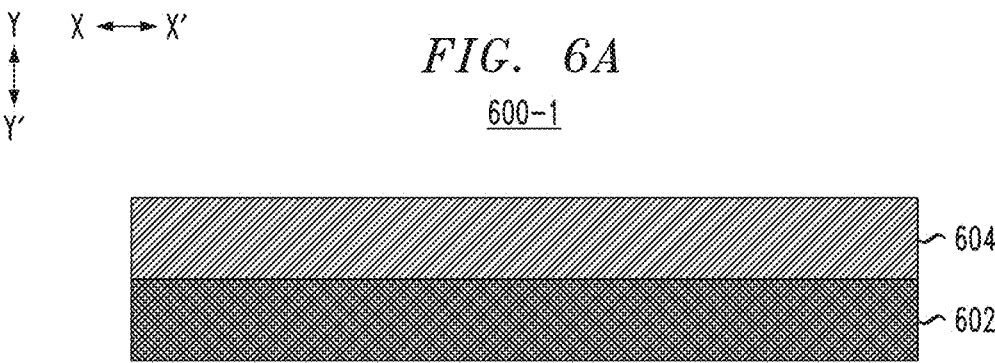
FIGS. 6A-6M depict a process flow for forming an access device stacked over a conductive bridge random access memory element, according to an embodiment of the invention.

FIG. 6A shows a cross-sectional view 600-1 of a structure including a substrate 602 over which an encapsulation layer 604 is formed. The substrate 602 may be formed of Si or another suitable material such as silicon germanium (SiGe), silicon germanium carbide (SiGeC), silicon carbide (SiC) or other Si-based materials, a silicon-on-insulator (SOI), other non-Si based materials, etc. The encapsulation layer 604 may be formed of SiN or another suitable material such as silicon oxide (SiO$_x$), silicon oxynitride (SiO$_x$N$_y$), silicon carbon nitride (SiCN), boron nitride (BN), boron carbon nitride (BCN), etc. The substrate 602 may have a height (in direction Y-Y') in the range of 50-800 nanometers (nm), and the encapsulation layer 604 may have a height (in direction Y-Y') in the range of 5-100 nm.

Figure 6B:
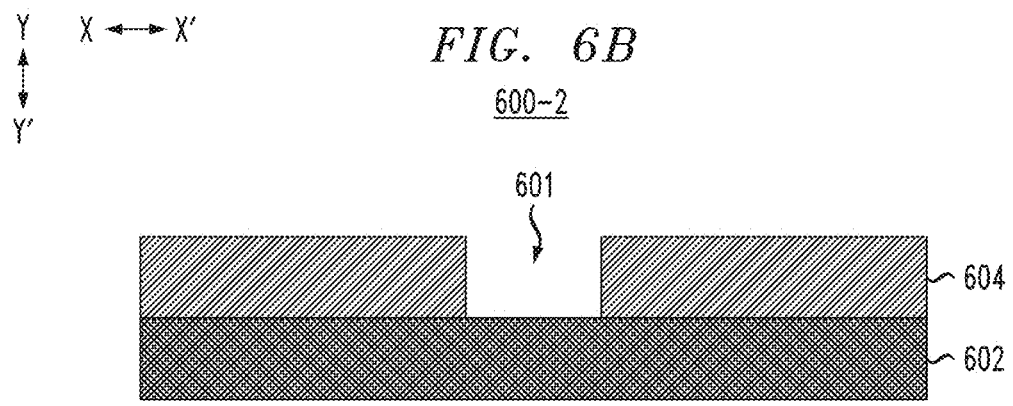

FIG. 6B shows a cross-sectional view 600-2 of the FIG. 6A structure following patterning of an opening 601 in the encapsulation layer 604. The opening 601 may have a width (in direction X-X') in the range of 20-500 nm. The opening 601 may be formed through patterning a mask over the encapsulation layer 604 and etching exposed portions of the encapsulation layer 604.

Figure 6C:
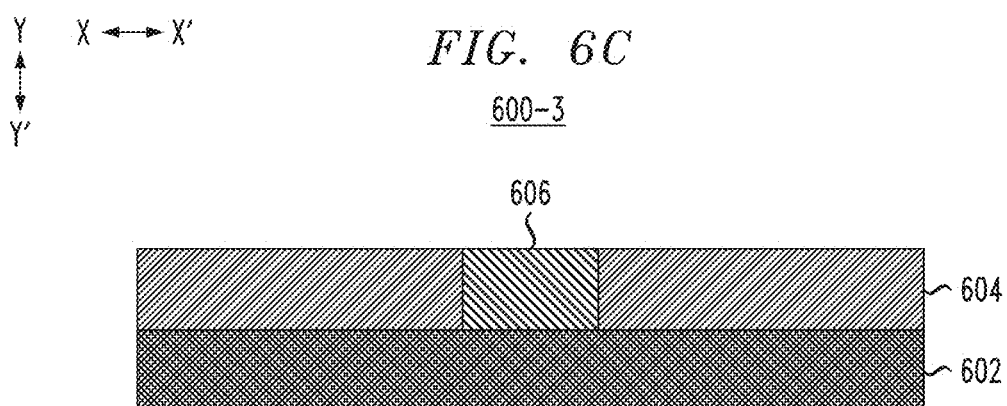

FIG. 6C shows a cross-sectional view 600-3 of the FIG. 6B structure following forming of a confined electrode 606 in the opening 601. The confined electrode 606 may be formed of TiN or another suitable material such as tantalum nitride (TaN), tungsten (W), ruthenium (Ru), iridium (Ir), etc. The confined electrode 606 may be formed by overfilling the opening 601, follow by planarization (e.g., using CMP).

Figure 6D:
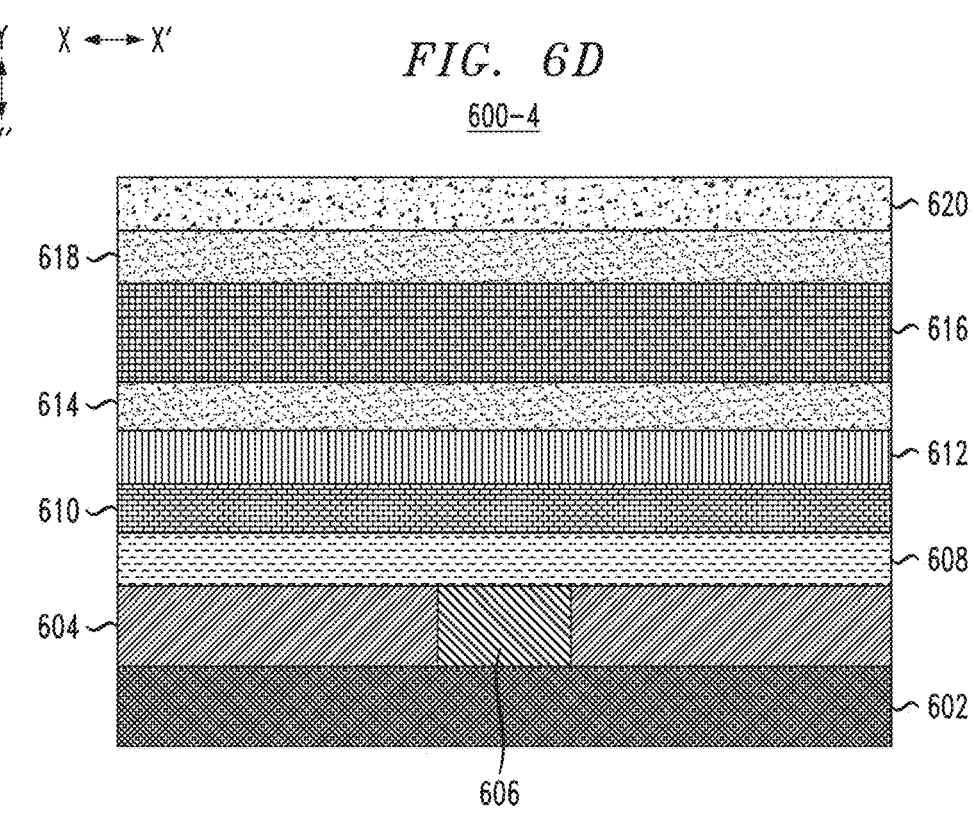

FIG. 6D shows a cross-sectional view 600-4 of the FIG. 6C structure following deposition of a stack of materials, including a first CBRAM device electrode 608, a solid electrolyte layer 610, a second CBRAM device electrode 612, a first access device electrode 614, an access device layer 616, a second access device electrode 618, and a hard mask layer 620. This stack of materials may be formed using any suitable deposition techniques, such as chemical vapor deposition (CVD), physical vapor deposition (PVD), atomic layer deposition (ALD), etc.

In some embodiments, it is assumed that the first CBRAM device electrode 608 is the counter electrode of the CBRAM device and that the second CBRAM device electrode 612 (e.g., proximate the access device layer 616) is the active electrode of the CBRAM device. This, however, is not a requirement. In other embodiments, the first CBRAM device electrode 608 is the active electrode of the CBRAM device and the second CBRAM device electrode 612 is the counter electrode of the CBRAM device. The active electrode of the CBRAM device may be formed of Cu, Ag, combinations thereof, etc. The counter electrode of the CBRAM device may be formed of W, Pt, Ni, TiW, TaN, combinations thereof, etc. The solid electrolyte layer 610 may be formed of $SiO_2$, $Cu_2S$, $Ge_xS_y$, GexSey, combinations thereof, etc. The first CBRAM device electrode 608 may have a height (in direction Y-Y') in the range of 5-100 nm, the solid electrolyte layer 610 may have a height (in direction Y-Y') in the range of 5-100 nm, and the second CBRAM device electrode 612 may have a height (in direction Y-Y') in the range of 5-100 nm.

The first and second access device electrodes 614 and 618 may be formed of ruthenium (Ru) or another suitable material such as silver (Ag), gold (Au), nickel (Ni), iron (Fe), W, TiN, etc. The access device layer 616 may comprise an MIEC material, such as $Cu_xGe_yS_z$. The first and second access device electrodes 614 and 618 may each have a height (in direction Y-Y') in the range of 5-100 nm, and the access device layer 616 may have a height (in direction Y-Y') in the range of 5-100 nm.

The hard mask layer 620 may be formed of TaN or another suitable material such as TiN, WN, etc. The hard mask layer 620 may have a height (in direction Y-Y') in the range of 5-100 nm.

Figure 6E:
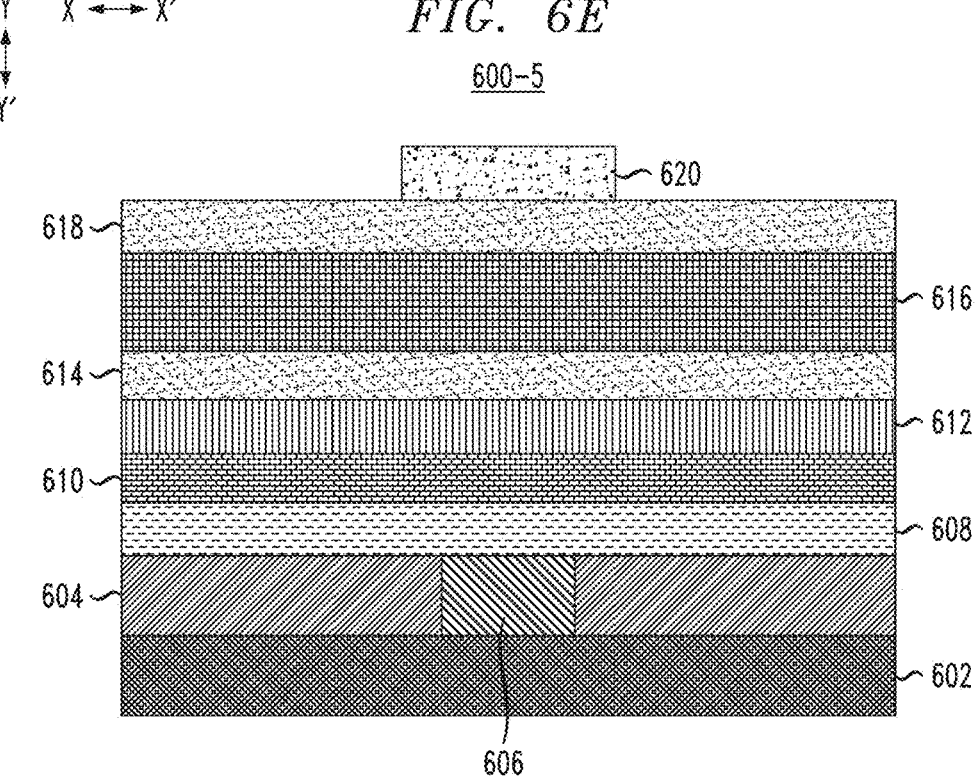

FIG. 6E shows a cross-sectional view 600-5 of the FIG. 6D structure following patterning of the hard mask layer 620. The hard mask layer 620 may be patterned using lithography and etch processing. The resulting width (in direction X-X') of the hard mask layer 620, following patterning, may be in the range of 20-1000 nm.

Figure 6F:
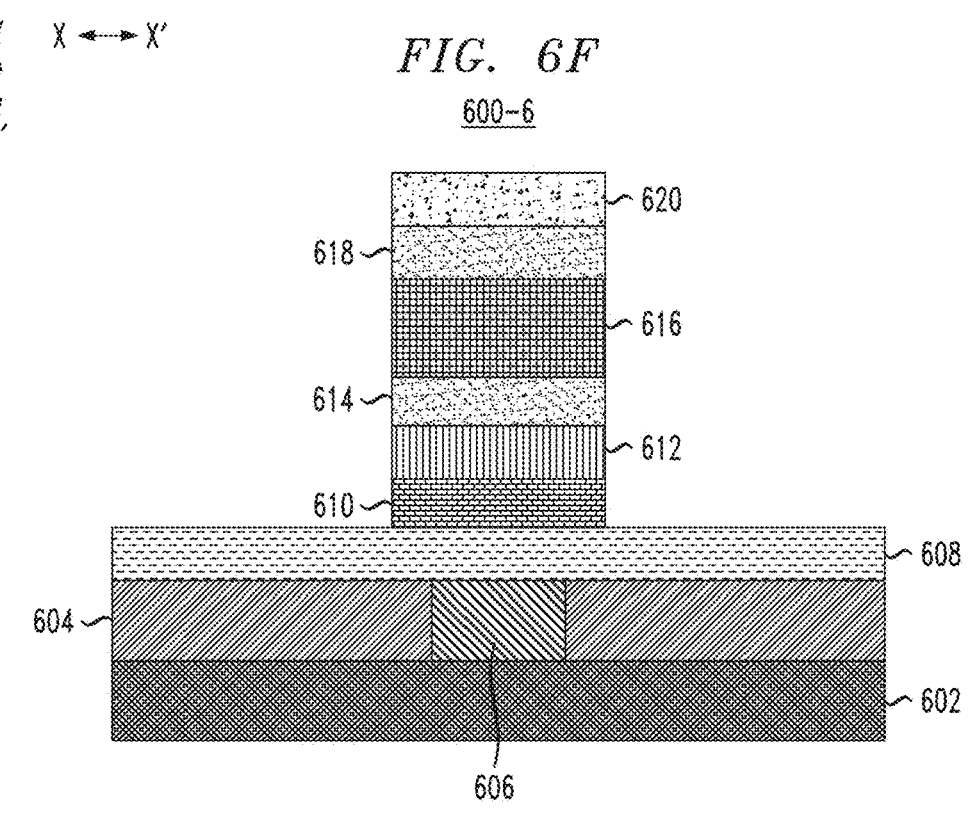

FIG. 6F shows a cross-sectional view 600-6 of the FIG. 6E structure following etching portions of the stack of materials (e.g., the solid electrolyte layer 610, the second CBRAM device electrode 612, the first access device electrode 614, the access device layer 616, and the second access device electrode 618) exposed by the patterned hard mask layer. This etching stops on the first CBRAM device electrode 608. The stack of materials may be etched using reactive-ion etching (RIE) or other suitable etch processing. In some embodiments, multiple etch chemistries are used to etch the different materials in the stack.

Figure 6G:
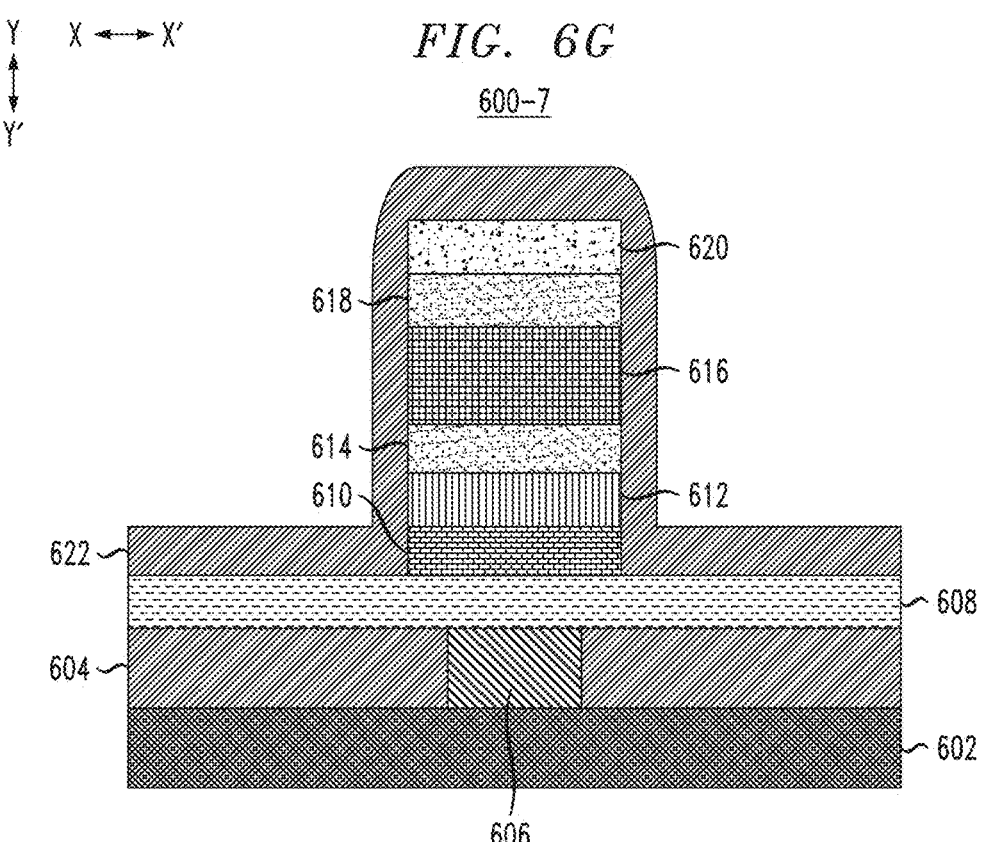

FIG. 6G shows a cross-sectional view 600-7 of the FIG. 6F structure following formation of a spacer layer 622. The spacer layer 622 may be formed of SiN or another suitable material such as SiCN, BN, BCN, etc. The spacer layer 622 may have a uniform thickness in the range of 5-100 nm.

Figure 6H:
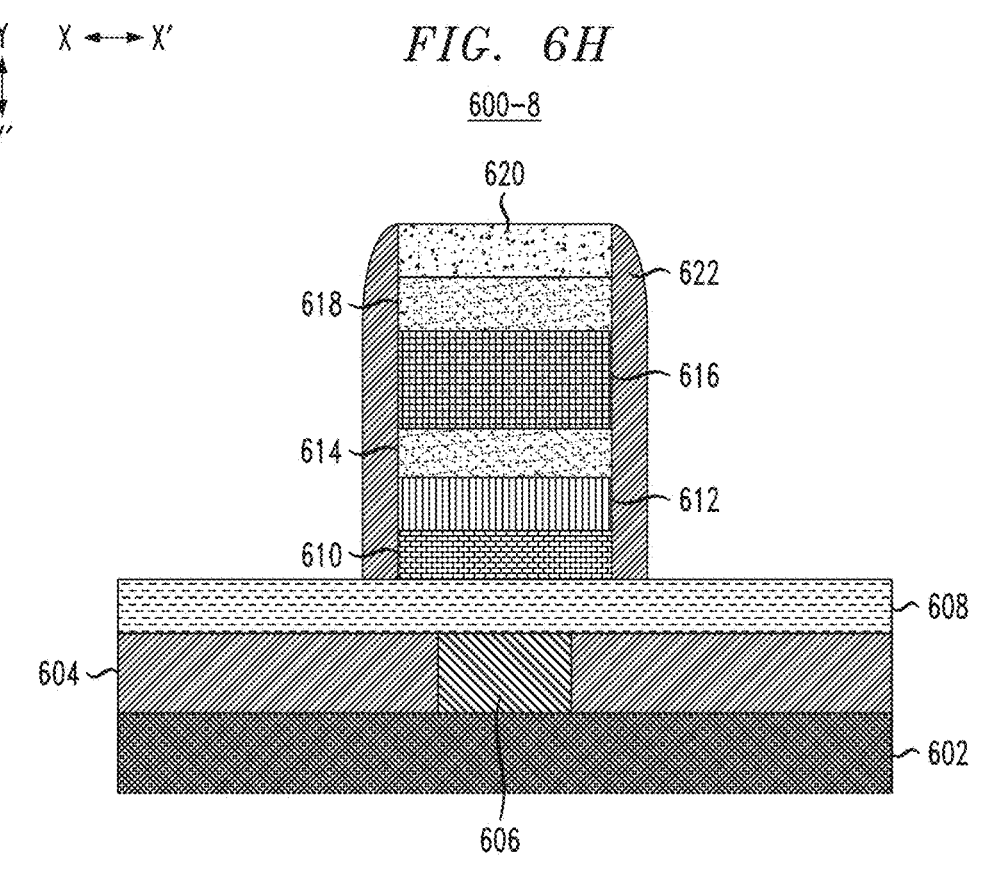

FIG. 6H shows a cross-sectional view 600-8 of the FIG. 6G structure following etching of portions of the spacer layer 622 (e.g., using an anisotropic or directional etch). The remaining portions of the spacer layer 622 provide sidewall spacers for the stack of materials (e.g., the solid electrolyte layer 610, the second CBRAM device electrode 612, the first access device electrode 614, the access device layer 616, and the second access device electrode 618).

Figure 6I:
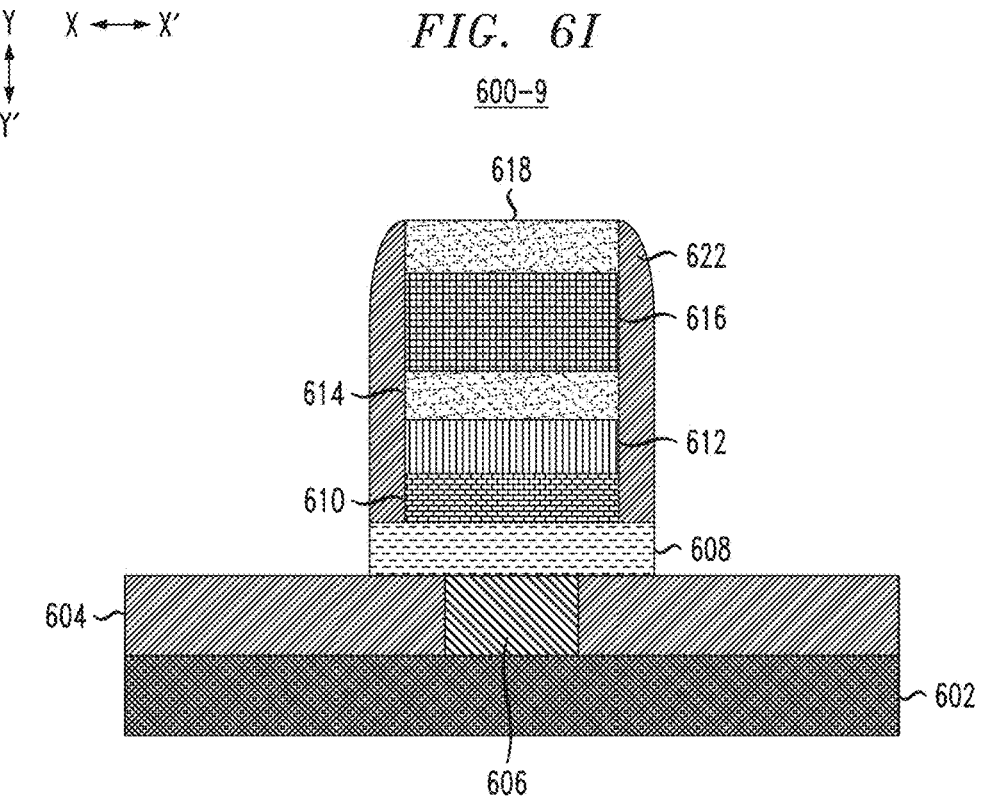

FIG. 6I shows a cross-sectional view 600-9 of the FIG. 6H structure following patterning of the first CBRAM device electrode 608. The first CBRAM device electrode 608 may be patterned using an etch (e.g., RIE or other suitable etch processing) that also removes the remaining portion of the hard mask layer 620 and portions of the spacer layer 622.

Figure 6J:
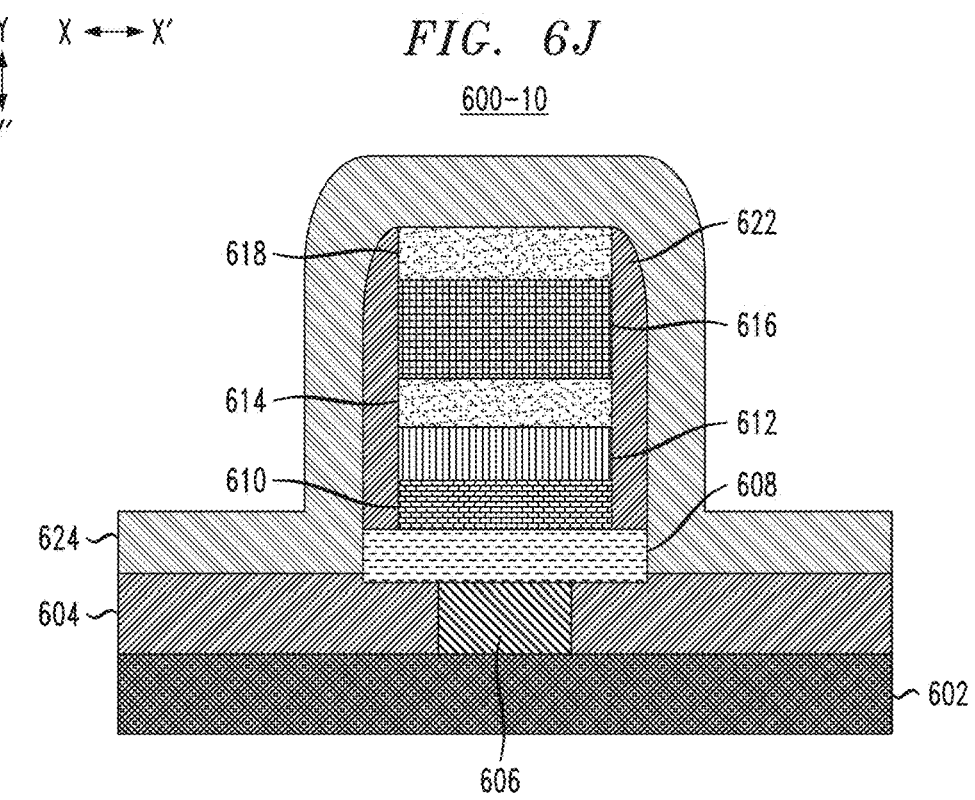

FIG. 6J shows a cross-sectional view 600-10 of the FIG. 6I structure following formation of an encapsulation layer 624. The encapsulation layer 624 may comprise SiN or another suitable material such as SiCN, BN, BCN, etc. The encapsulation layer 624 may have a uniform thickness in the range of 5-100 nm.

Figure 6K:
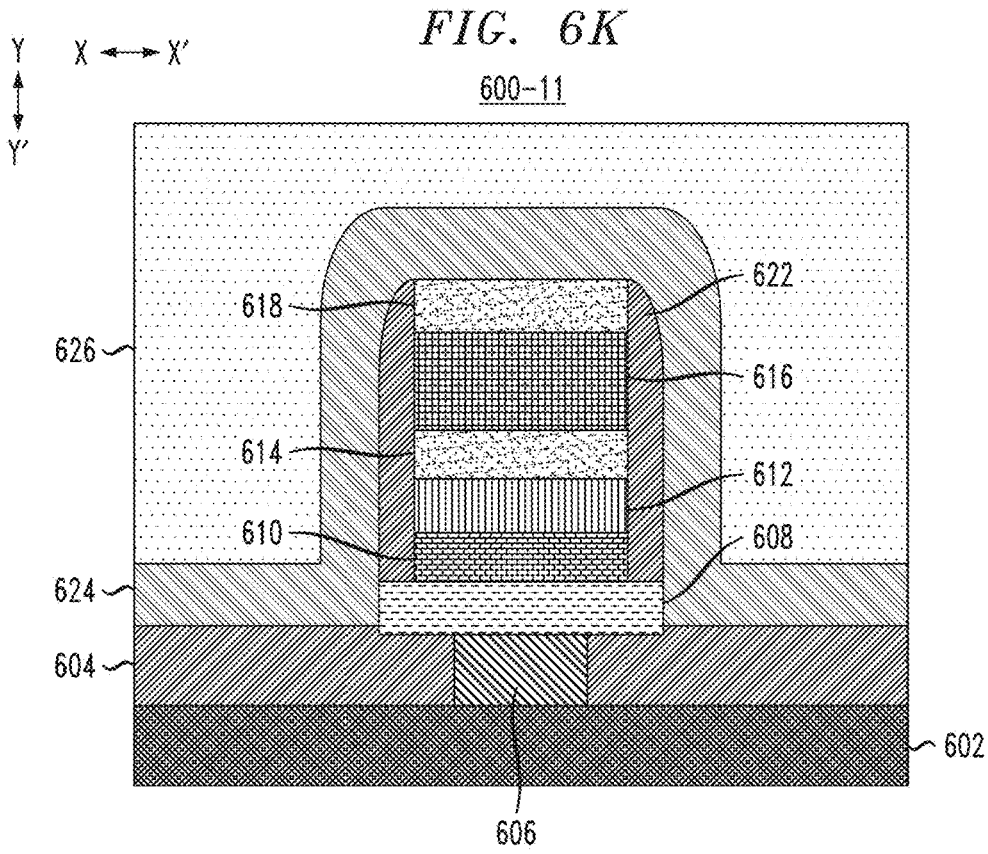

FIG. 6K shows a cross-sectional view 600-11 of the FIG. 6J structure following formation of an interlevel dielectric (ILD) layer 626. The ILD layer 626 may be formed of SiO or another suitable material such as SiN. The ILD layer 626 is formed with a height (in direction Y-Y') sufficient to overfill the structure.

Figure 6L:
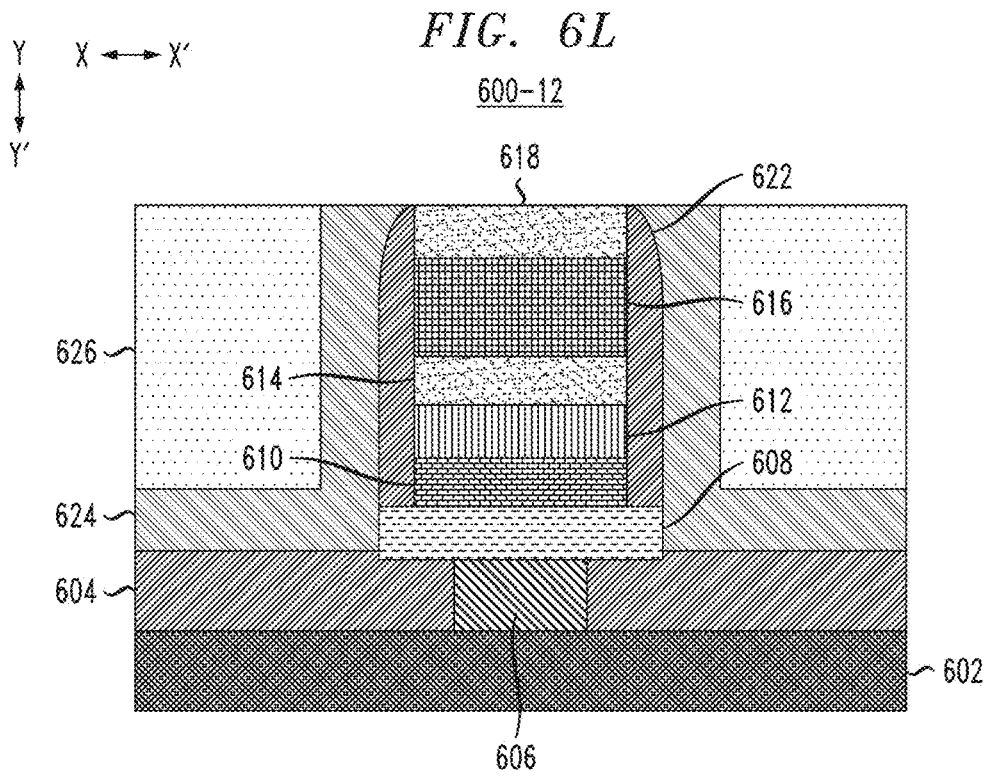

FIG. 6L shows a cross-sectional view 600-12 of the FIG. 6K structure following planarization to expose the second access device electrode 618. This may utilize CMP or other suitable processing.

Figure 6M:
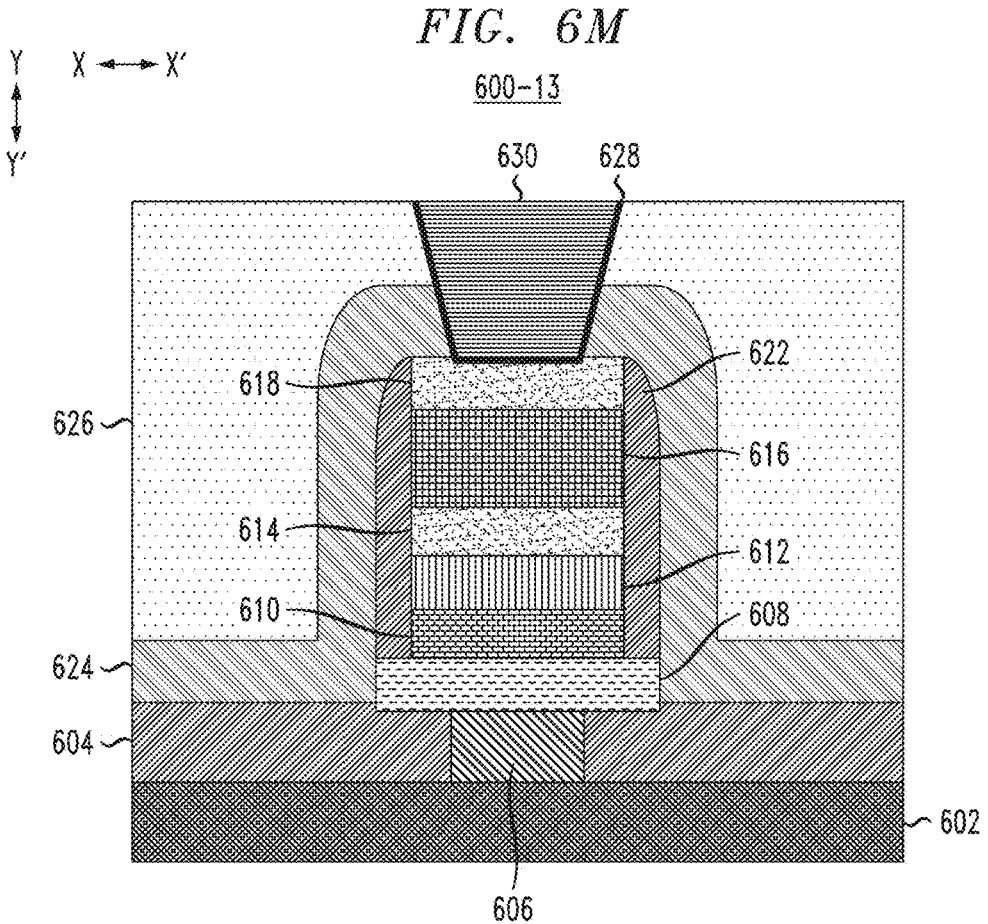

FIG. 6M shows a cross-sectional view 600-13 of the FIG. 6K structure following patterning of a trench in the ILD layer 626 and the encapsulation layer 624 to expose a portion of the second access device electrode 618. This may be performed using lithography and etch processing. A liner layer 628 and metal layer 630 are then formed to provide a contact to the second access device electrode 618. The liner layer 628, which may also be referred to as a metal adhesion or barrier layer, may be formed of various materials depending on the material that is used for the metal layer 630. The liner layer 628 may have a uniform thickness in the range of 2-5 nm. The metal layer 630 may be formed of a low resistance metal such as Cu, Ru, W, cobalt (Co), etc. The metal layer 630 may have a width (in direction X-X') in the range of 20-1000 nm. As noted above, the material of the liner layer 628 may vary based on what material is used for the metal layer 630. For example, if the metal layer 630 is formed of Cu, the liner layer 628 may be formed of tantalum (Ta) or TaN. As another example, if the metal layer 630 is formed of W or Co, the liner layer 628 may be formed of TiN. Various other combinations of materials for the liner layer 628 and the metal layer 630 may be utilized.

Figure 7A:
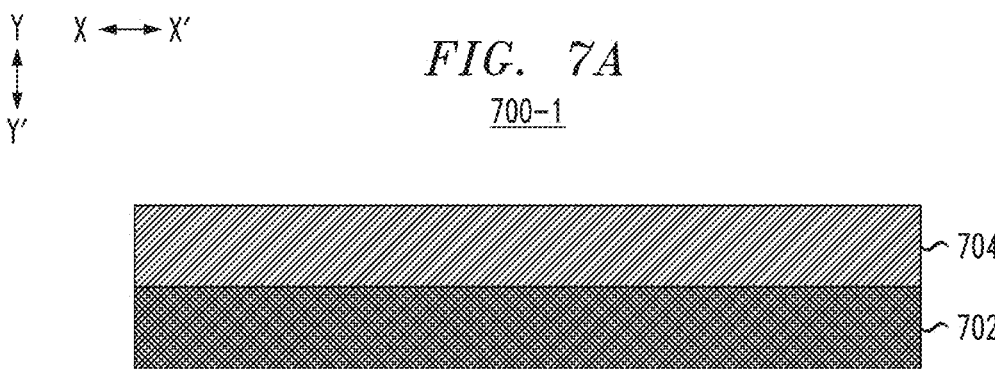
FIGS. 7A-7N depict a process flow for forming a conductive bridge random access memory element stacked over an access device, according to an embodiment of the invention.

While FIGS. 6A-6M illustrate processes for forming a stack of CBRAM device and an AD where the AD is formed over the CBRAM device (e.g., as shown in FIG. 4B), in other embodiments the CBRAM device may be formed over the AD (e.g., as shown in FIG. 4D). FIGS. 7A-7N depict process flows for forming a stack of a CBRAM device and an AD, where the CBRAM device is formed over the AD.

FIG. 7A shows a cross-sectional view 700-1 of a structure including a substrate 702 over which an encapsulation layer 704 is formed. The substrate 702 and encapsulation layer 704 may be formed of similar materials, and with similar sizing and processing as that described above with respect to the substrate 602 and the encapsulation layer 604.

Figure 7B:
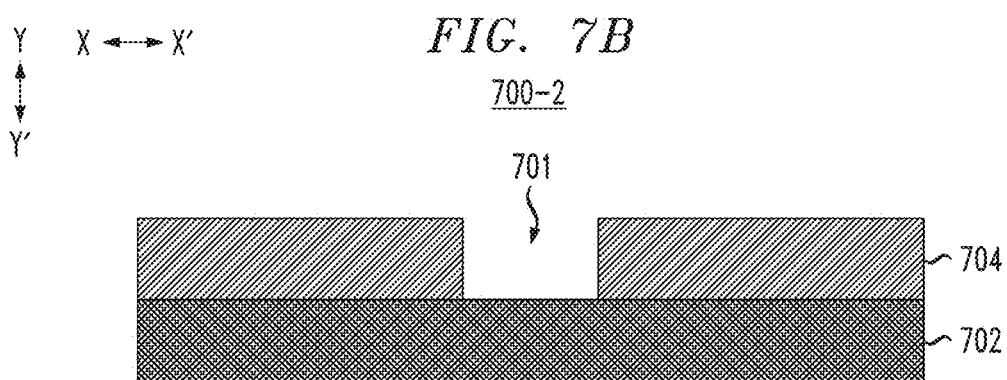

FIG. 7B shows a cross-sectional view 700-2 of the FIG. 7A structure following patterning of an opening 701 in the encapsulation layer 704. The opening 701 may be formed with similar sizing and processing as that described above with respect to opening 601.

Figure 7C:
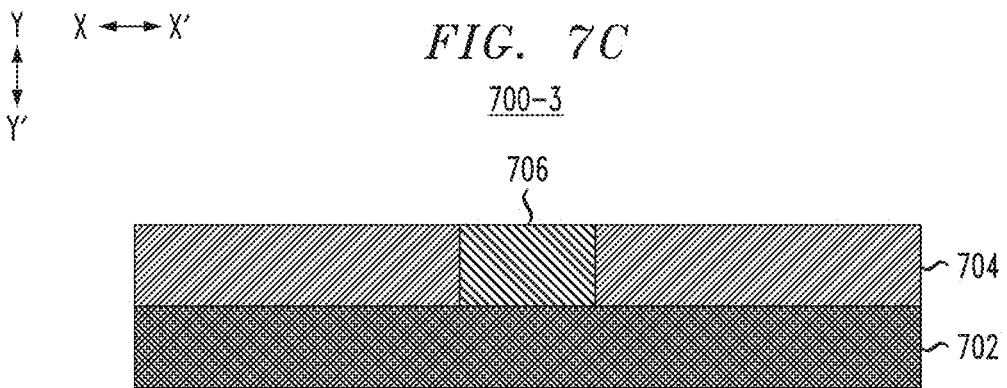

FIG. 7C shows a cross-sectional view 700-3 of the FIG. 7B structure following forming of a confined electrode 706 in the opening 701. The confined electrode 706 may be formed of similar materials, and with similar sizing and processing as that described above with respect to the confined electrode 606.

Figure 7D:
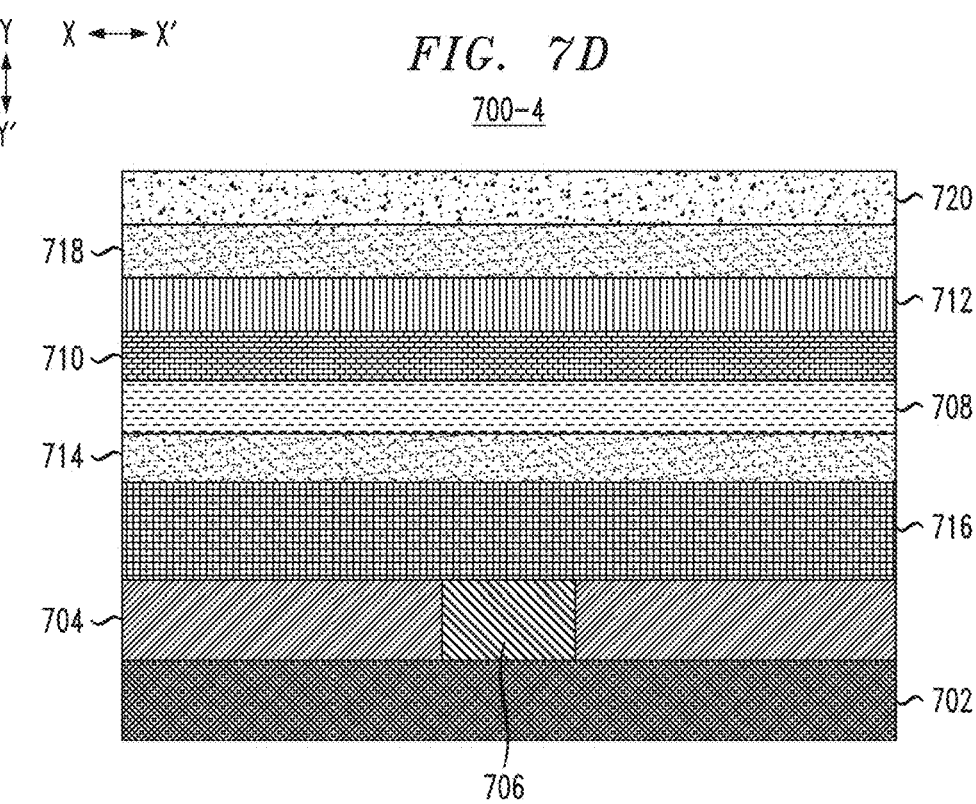

FIG. 7D shows a cross-sectional view 700-4 of the FIG. 7C structure following deposition of a stack of materials, including an access device layer 716, an access device electrode 714, a first CBRAM device electrode 708, a solid electrolyte layer 710, a second CBRAM device electrode 712, a top electrode layer 718, and a conductive hard mask layer 720. The access device layer 716, the access device electrode 714, the first CBRAM device electrode 708, the solid electrolyte layer 710, the second CBRAM device electrode 712, the top electrode layer 718 and the conductive hard mask layer 720 may be formed of similar materials, and with similar sizing and processing as that described above with respect to the access device layer 616, the first access device electrode 614, the first CBRAM device electrode 608, the solid electrolyte layer 610, the second CBRAM device electrode 612, the second access device electrode 618, and the hard mask layer 620, respectively, though the order of the materials in the stack differs as shown.

Figure 7E:
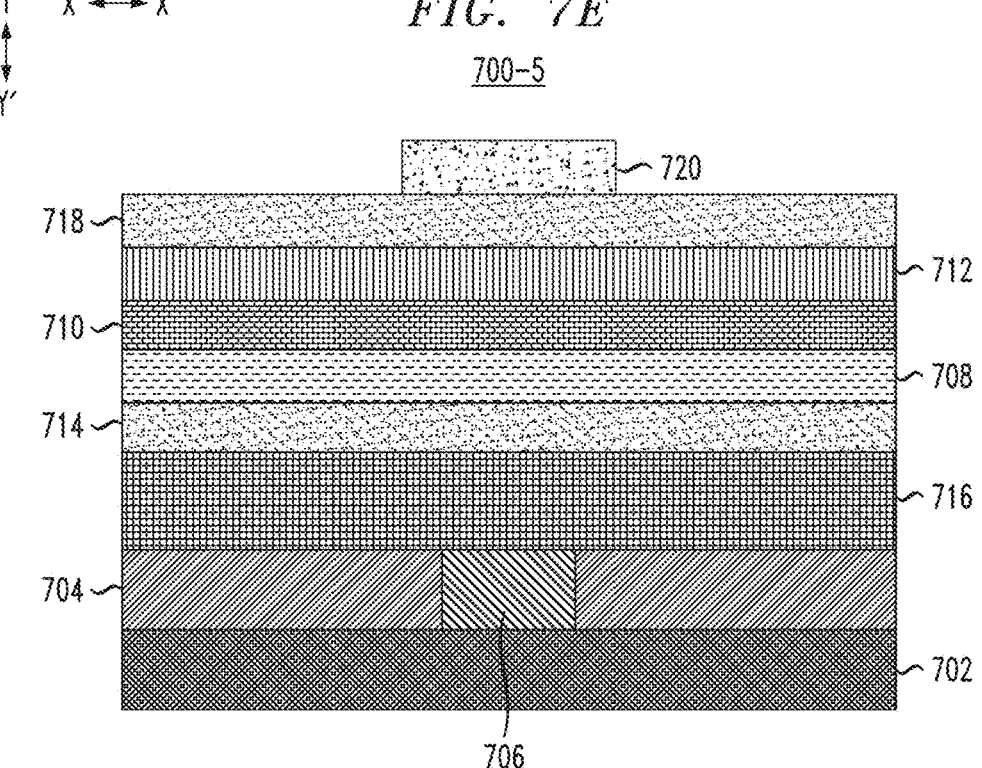

FIG. 7E shows a cross-sectional view 700-5 of the FIG. 7D structure following patterning of the conductive hard mask layer 720. The conductive hard mask layer 720 may be patterned using similar processing as that described above with respect to patterning of the hard mask layer 620. The resulting patterned conductive hard mask layer 720 may have a similar size as the patterned hard mask layer 620.

Figure 7F:
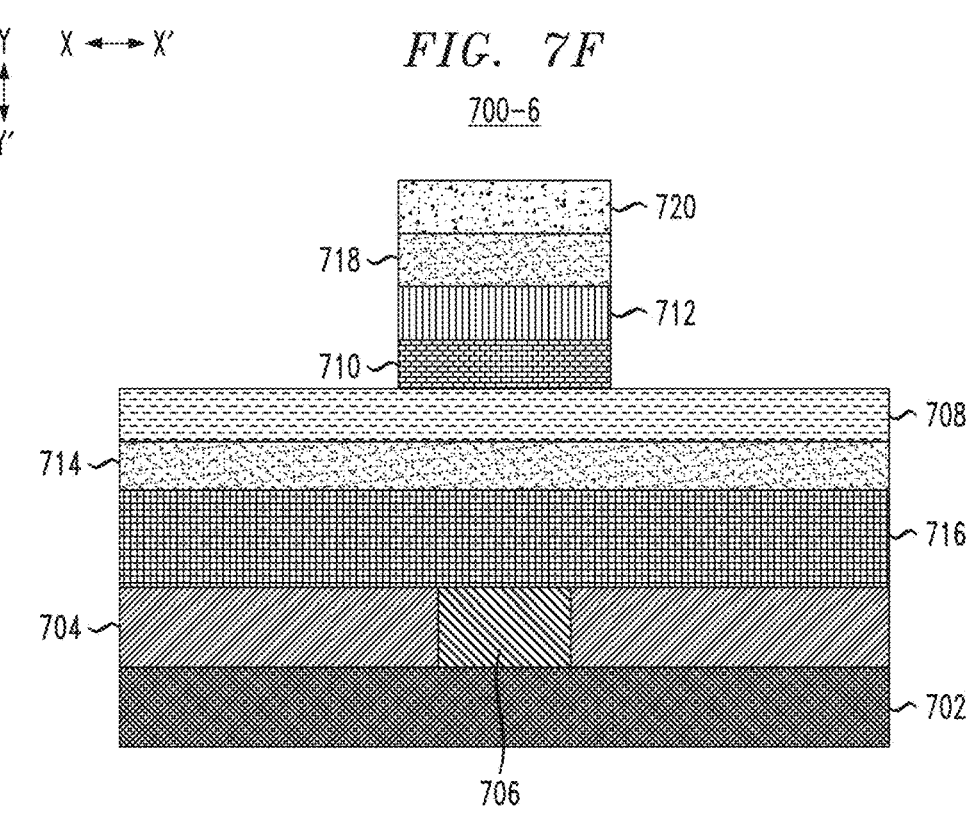

FIG. 7F shows a cross-sectional view 700-6 of the FIG. 7E structure following etching portions of the top electrode layer 718, the second CBRAM device electrode 712, and the solid electrolyte layer 710 which are exposed by the patterned conductive hard mask layer 720. This etching may utilize RIE or other suitable etch processing.

Figure 7G:
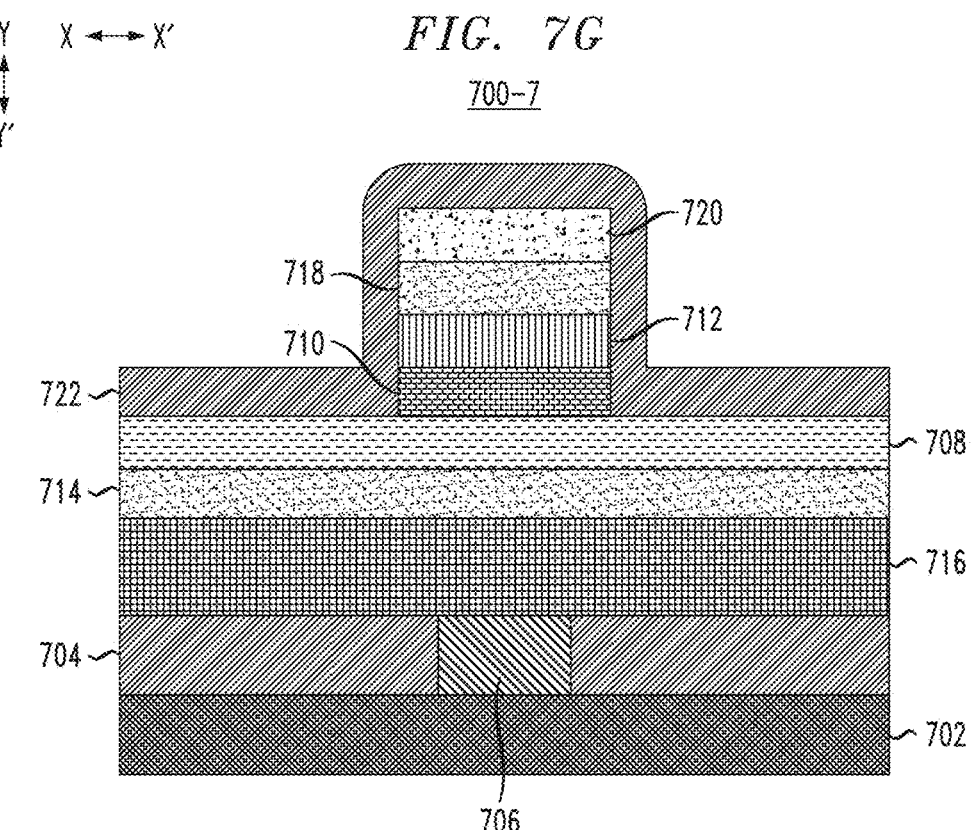

FIG. 7G shows a cross-sectional view 700-7 of the FIG. 7F structure following formation of a spacer layer 722. The spacer layer 722 may be formed of similar materials, and with similar sizing and processing, as that described above with respect to the spacer layer 622.

Figure 7H:
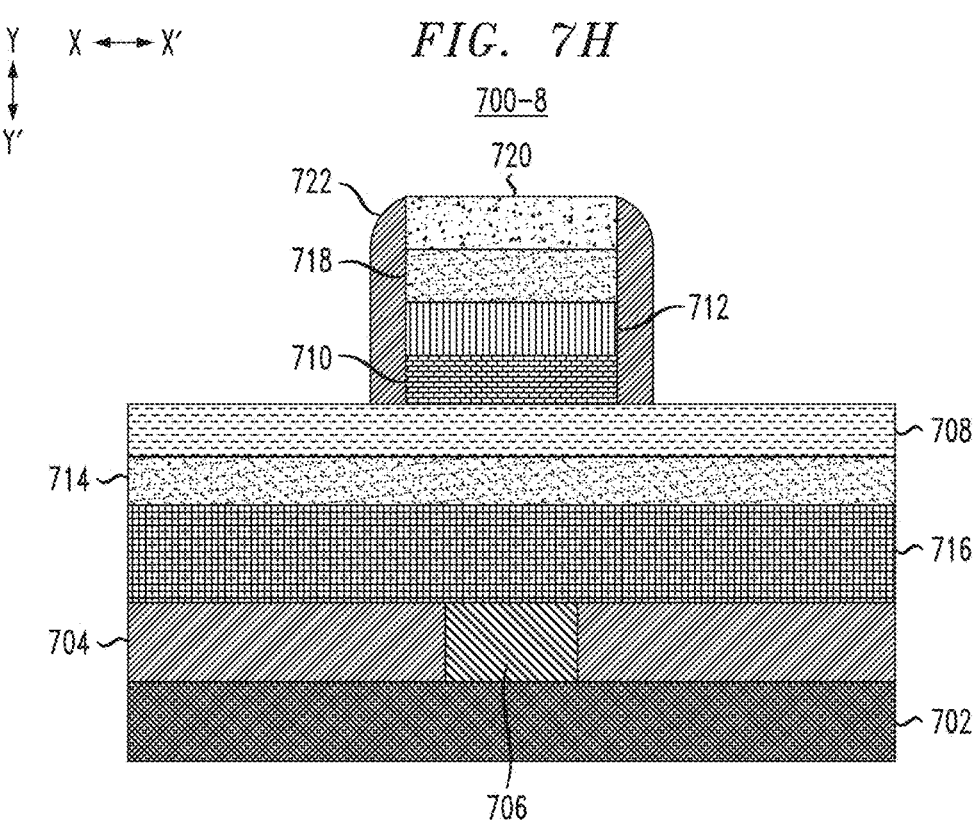

FIG. 7H shows a cross-sectional view 700-8 of the FIG. 7G structure following etching of portions of the spacer layer 722 (e.g., using an anisotropic or directional etch). The remaining portions of the spacer layer 722 provide sidewall spacers for the solid electrolyte layer 710, the second CBRAM device electrode 712, and the top electrode layer 718.

Figure 7I:
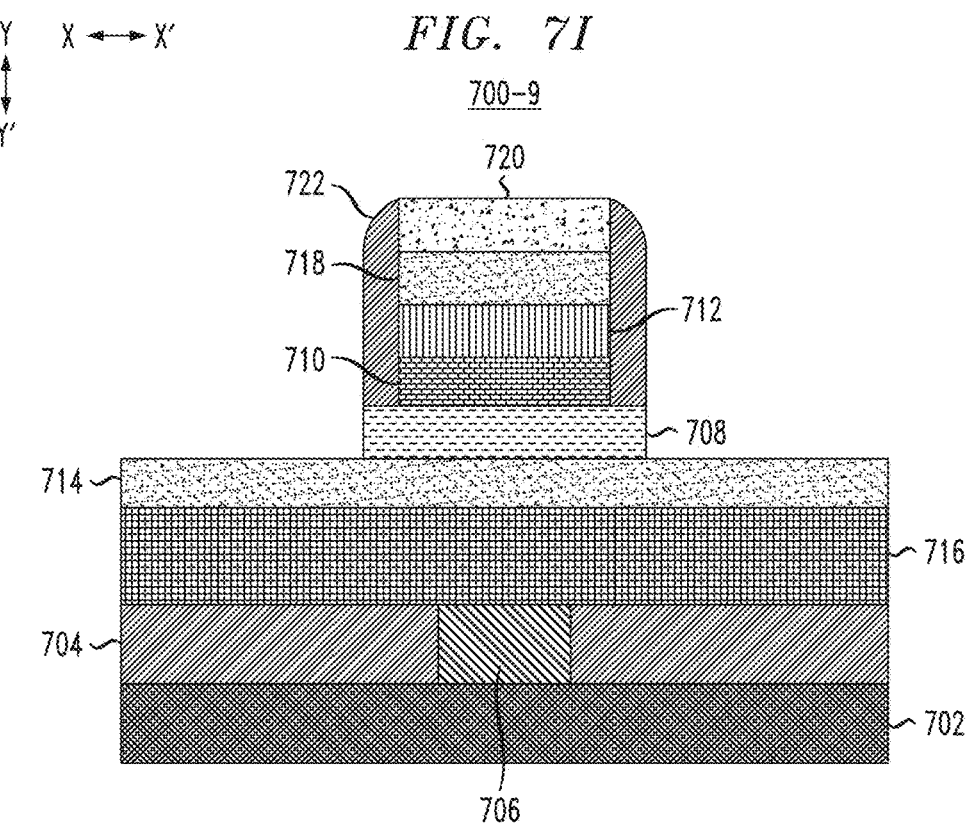

FIG. 7I shows a cross-sectional view 700-9 of the FIG. 7H structure following patterning of the first CBRAM device electrode 708. The first CBRAM device electrode 708 may be patterned using an etch process (e.g., RIE or other suitable etch processing).

Figure 7J:
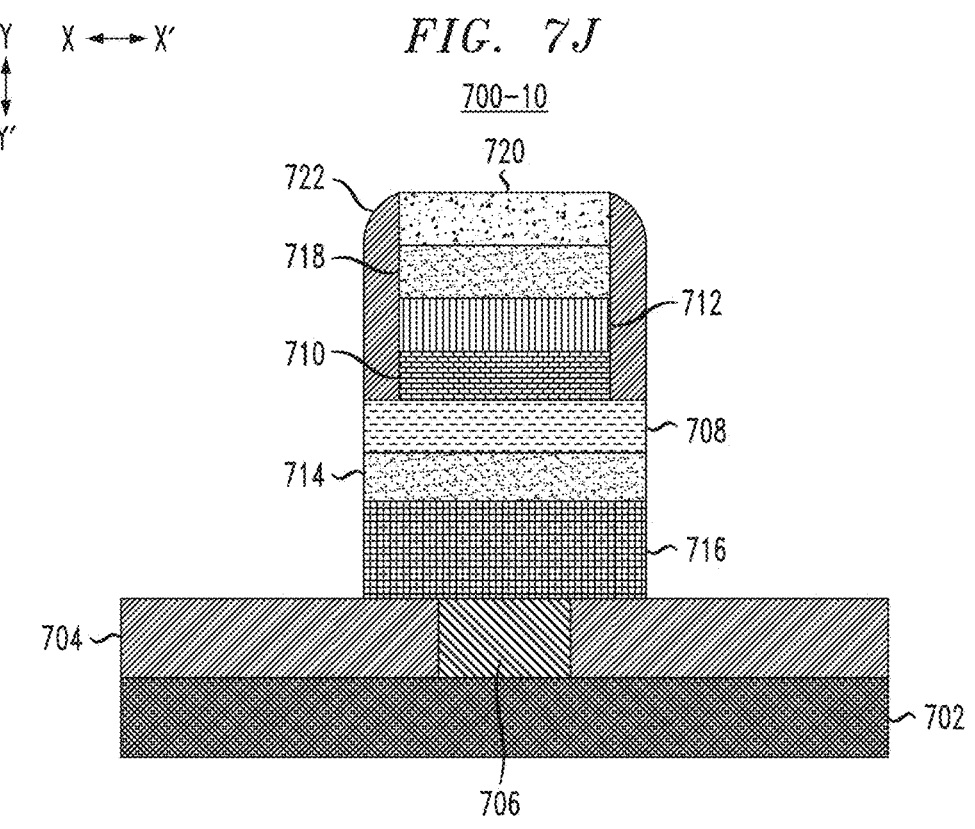

FIG. 7J shows a cross-sectional view 700-10 of the FIG. 7I structure following etching portions of the access device layer 716 and the access device electrode 714 which are exposed by the patterned conductive hard mask layer 720 and spacer layer 722.

Figure 7K:
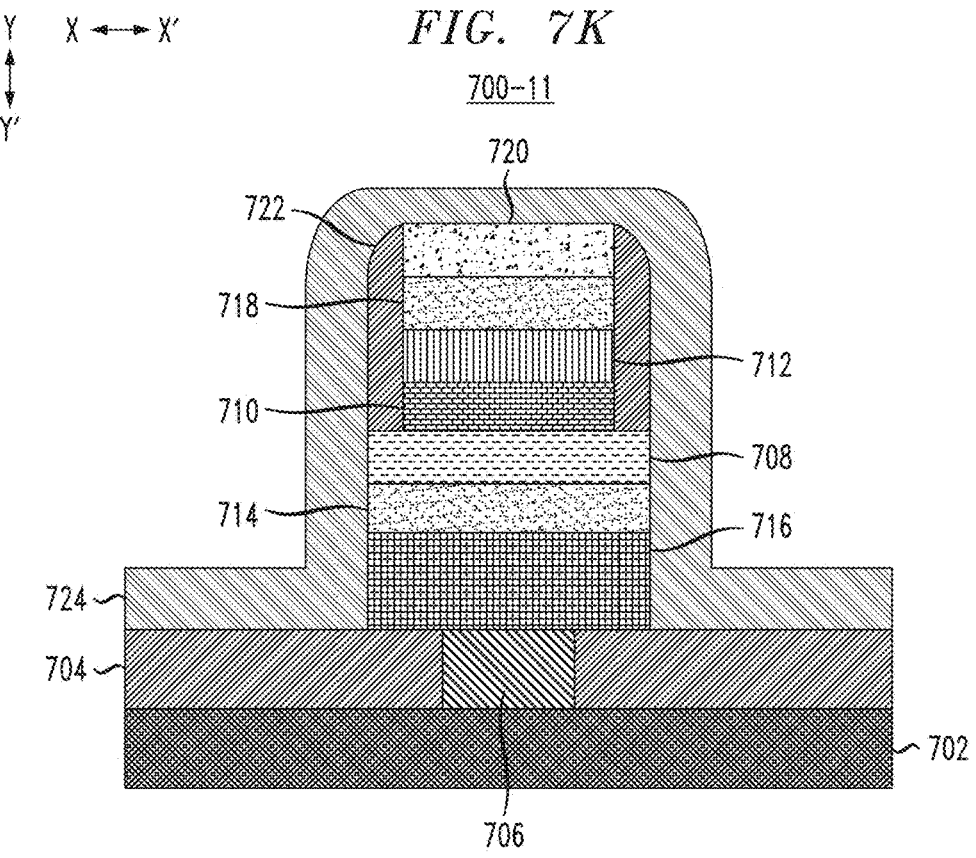

FIG. 7K shows a cross-sectional view 700-11 of the FIG. 7J structure following formation of an encapsulation layer 724. The encapsulation layer 724 may be formed of similar materials, and with similar sizing and processing as that described above with respect to the encapsulation layer 624.

Figure 7L:
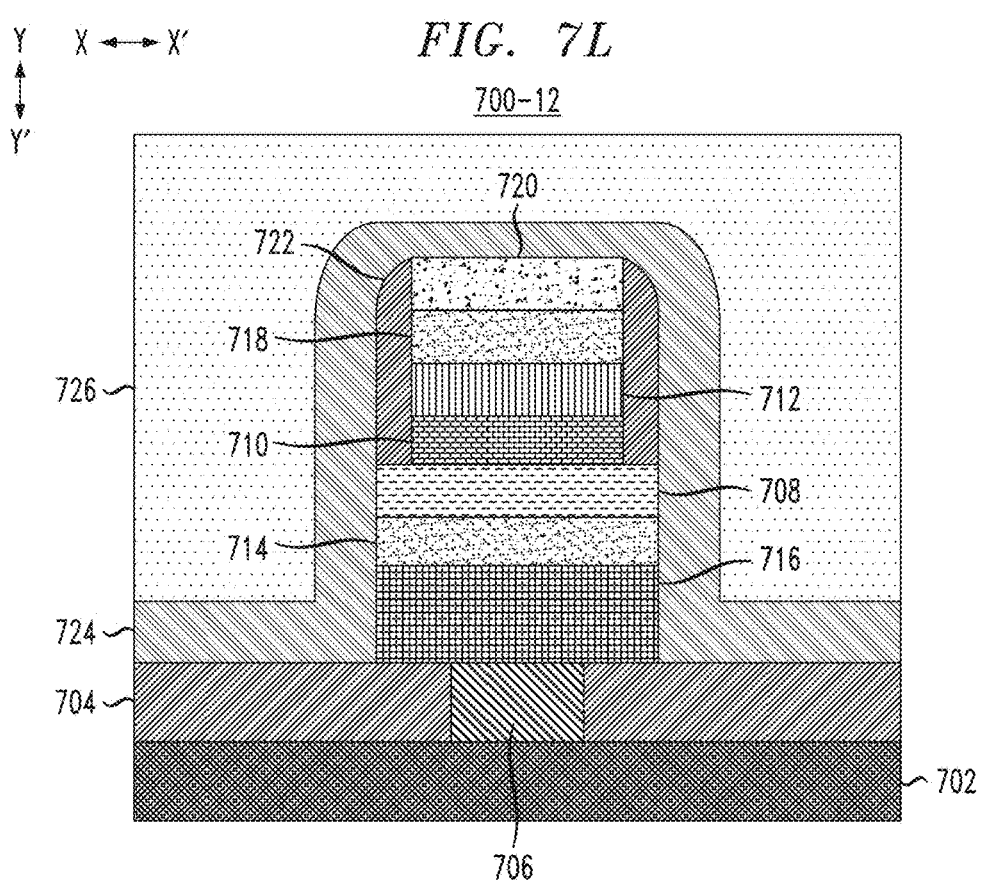

FIG. 7L shows a cross-sectional view 700-12 of the FIG. 7K structure following formation of an ILD layer 726. The ILD layer 726 may be formed of similar materials, and with similar sizing and processing as that described above with respect to the ILD layer 626.

Figure 7M:
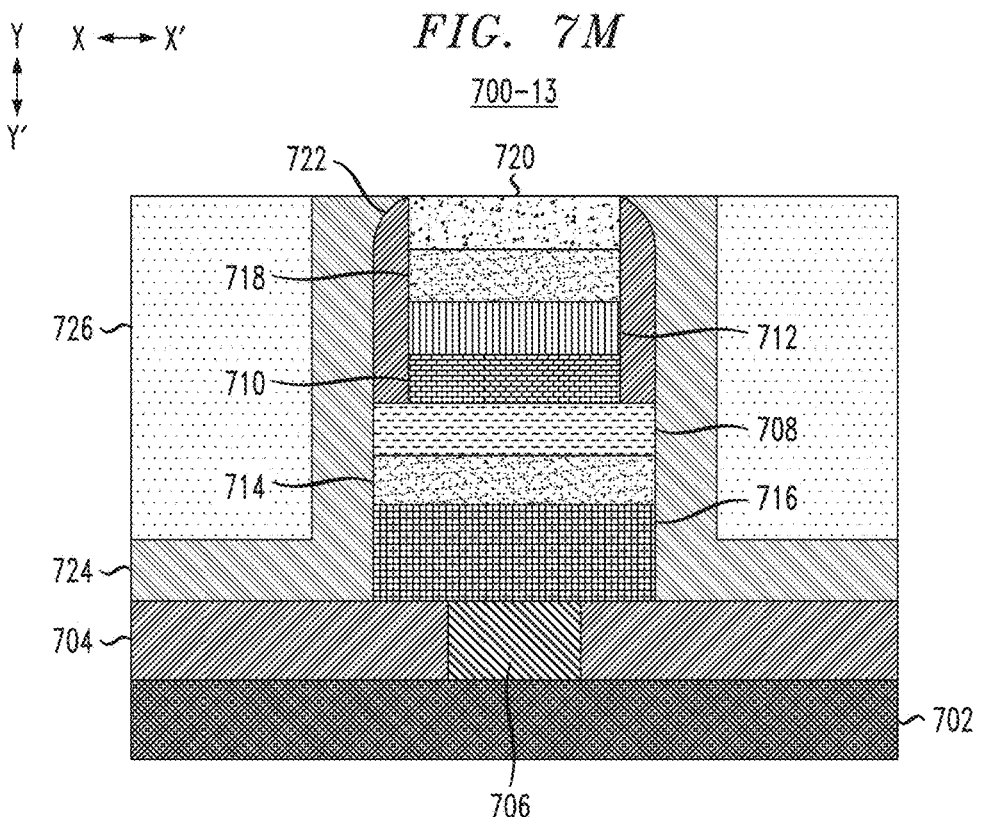
Figure 7N:
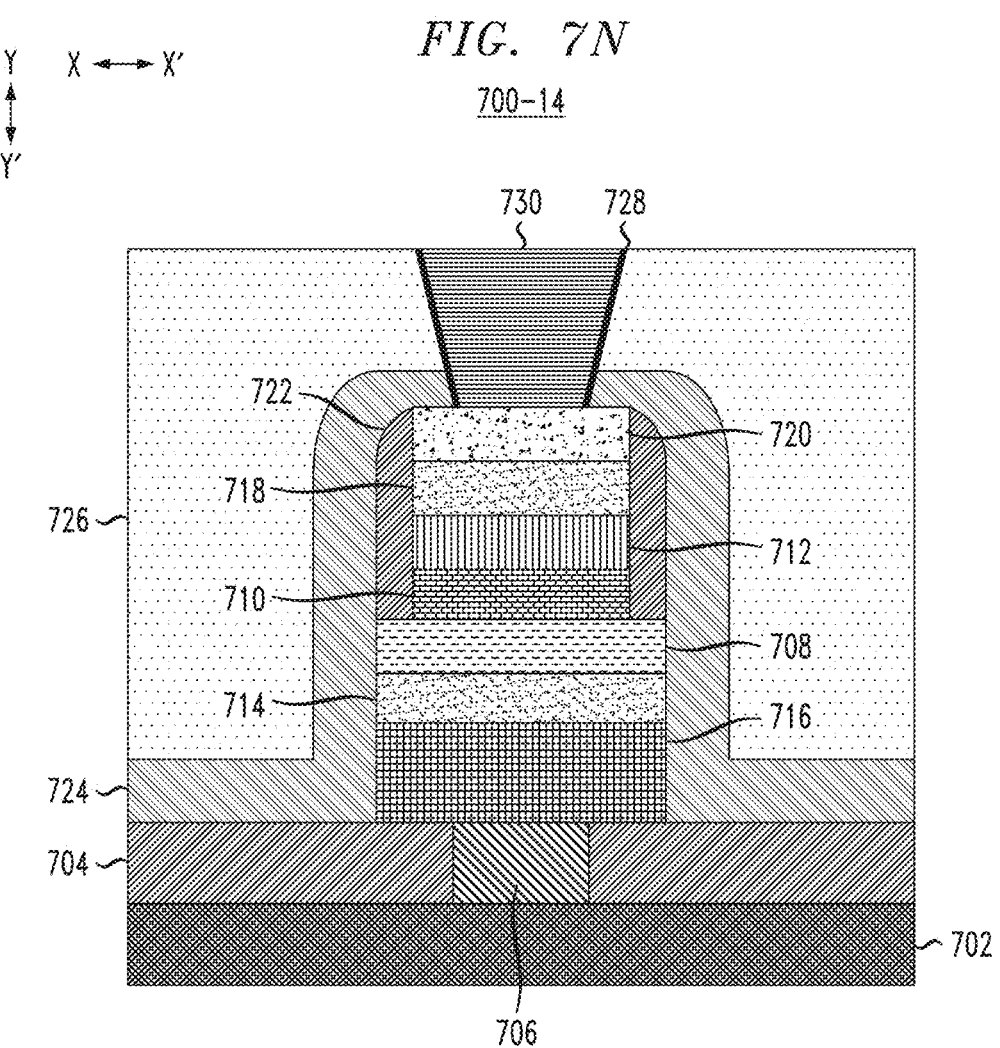

FIG. 7M shows a cross-sectional view 700-13 of the FIG. 7L structure following planarization to expose the patterned conductive hard mask layer 720. This may utilize CMP or other suitable processing.

FIG. 7N shows a cross-sectional view 700-14 of the FIG. 7L structure following patterning of a trench in the ILD layer 726 and the encapsulation layer 724 to expose a portion of the patterned conductive hard mask layer 720, and following formation of a liner layer 728 and metal layer 730 in the trench. The liner layer 728 and metal layer 730 may be formed of similar materials, and with similar sizing and processing as that described above with respect to the liner layer 628 and the metal layer 630.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 8:
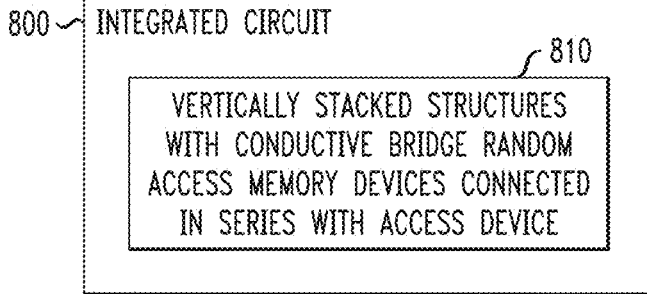
FIG. 8 depicts an integrated circuit comprising one or more vertically stacked structures including a conductive bridge random access memory device connected in series with an access device, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 8 shows an example integrated circuit 800 which includes one or more structures 810 with vertically stacked CBRAM devices connected in series with ADs as described elsewhere herein.

In some embodiments, a semiconductor structure comprises a CBRAM device and an access device connected in series with the CBRAM device. The CBRAM device and the access device are arranged in a vertical stack. The vertical stack has a sidewall profile that increases in width from a bottom surface of the vertical stack to a top surface of the vertical stack.

The CBRAM device may be disposed over the access device in the vertical stack, or the CBRAM device may be disposed below the active device in the vertical stack.

The CBRAM may comprise a solid electrolyte disposed vertically between an active electrode and a counter electrode. The solid electrolyte may comprise at least one of $SiO_2$, SiGe, Si, Ge, $Cu_2S$, $Ge_xS_y$, $Ge_xSe_y$, the active electrode may comprises at least one of Cu and Ag, and the counter electrode may comprise at least one of W, Pt, Ni, TiW, TiN and TaN.

The access device may comprise an MIEC based bi-polar current source. The MIEC based bi-polar current source may comprise $Cu_xGe_yS_z$.

The vertical stack of the CBRAM device and the access device may provide at least a portion of a crosspoint device coupled at a first end to a conductive row wire and at a second end to a conductive column wire. A half select voltage ($V_s/2$) applied at one of the conductive row wire and the conductive column wire is less than a threshold voltage of the access device, the threshold voltage of the access device is less than a sensing voltage of the crosspoint device, the sensing voltage of the crosspoint device is less than a switching threshold of the CBRAM device, and the switching threshold of the CBRAM device is less than a full select voltage ($V_s$) comprising a coincident application of the half select voltage ($V_s/2$) applied at both of the conductive row wire and the conductive column wire.

In some embodiments, an integrated circuit comprises a crossbar array structure comprising a plurality of crosspoint devices each coupled at a first end to one of a plurality of conductive row wires and at a second end to one of a plurality of conductive column wires. A given one of the plurality of crosspoint devices comprises a vertical stack of a CBRAM device and an access device connected in series with the CBRAM device, the vertical stack having a sidewall profile that increases in width from a bottom surface of the vertical stack to a top surface of the vertical stack.

The CBRAM device may be disposed over the access device in the vertical stack, or the CBRAM device may be disposed below the access device in the vertical stack.

The CBRAM may comprise a solid electrolyte disposed vertically between an active electrode and a counter electrode. The solid electrolyte may comprise at least one of $SiO_2$, SiGe, Si, Ge, $Cu_2S$, $Ge_xS_y$, $Ge_xSe_y$, the active electrode may comprises at least one of Cu and Ag, and the counter electrode may comprise at least one of W, Pt, Ni, TiW, TiN and TaN.

The access device may comprise an MIEC based bi-polar current source. The MIEC based bi-polar current source may comprise $Cu_xGe_yS_z$.

A half select voltage ($V_s/2$) applied at a given one of the plurality of conductive row wires coupled at a first end to the given crosspoint device and a given one of the plurality of conductive column wires coupled at a second end to the given crosspoint device is less than a threshold voltage of the access device, the threshold voltage of the access device is less than a sensing voltage of the given crosspoint device, the sensing voltage of the given crosspoint device is less than a switching threshold of the CBRAM device, and the switching threshold of the CBRAM device is less than a full select voltage ($V_s$) comprising a coincident application of the half select voltage ($V_s/2$) applied at both of the given conductive row wire and the given conductive column wire.

In some embodiments, a method comprises forming a vertical stack comprising a CBRAM device and an access device connected in series with the CBRAM device and patterning the vertical stack utilizing a subtractive etching process to form a patterned vertical stack having a sidewall profile that increases in width from a bottom surface of the patterned vertical stack to a top surface of the patterned vertical stack The CBRAM device may be disposed over the access device in the vertical stack, and forming the vertical stack may comprise depositing a first set of layers for the CBRAM device and depositing a second set of layers for the access device over the first set of layers. Patterning the vertical stack utilizing the subtractive etching process to form the patterned vertical stack may comprise patterning a hard mask over a top of the second set of layers and utilizing a single subtractive etching process to remove portions of the second set of layers and the first set of layers exposed by the patterned hard mask.

The CBRAM device may be disposed below the access device in the vertical stack, and forming the vertical stack may comprise depositing a first set of layers for the access device and depositing a second set of layers for the CBRAM device over the first set of layers. Patterning the vertical stack utilizing the subtractive etching process to form the patterned vertical stack may comprise patterning a hard mask over a top of the second set of layers and a utilizing two or more subtractive etching processes to remove portions of the second set of layers and the first set of layers exposed by the patterned hard mask.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a conductive bridge random access memory device; and
an access device connected in series with the conductive bridge random access memory device;
wherein the conductive bridge random access memory device and the access device are arranged in a vertical stack;
wherein a surface of a mixed ionic-electronic conductor (MIEC) based bi-polar current source element of the access device is disposed adjacent a surface of the conductive bridge random access memory device in the vertical stack; and
wherein the vertical stack has a sidewall profile where each of the conductive bridge random access memory device and the access device has a width at its top surface that is less than a width at its bottom surface.

2. The semiconductor structure of claim 1, wherein the conductive bridge random access memory device is disposed over the access device in the vertical stack.

3. The semiconductor structure of claim 1, wherein the conductive bridge random access memory device is disposed below the access device in the vertical stack.

4. The semiconductor structure of claim 1, wherein the conductive bridge random access memory device comprises a solid electrolyte disposed vertically between an active electrode and a counter electrode.

5. The semiconductor structure of claim 4, wherein:
the solid electrolyte comprises at least one of silicon dioxide, silicon germanium, silicon, germanium, copper sulfide, germanium sulfide and germanium selenide;
the active electrode comprises at least one of copper and silver; and
the counter electrode comprises at least one of tungsten, platinum, nickel, tungsten-titanium, titanium nitride and tantalum nitride.

6. The semiconductor structure of claim 1, wherein the MIEC based bi-polar current source element comprises copper germanium sulfide.

7. The semiconductor structure of claim 1, wherein the vertical stack of the conductive bridge random access memory device and the access device provides at least a portion of a crosspoint device coupled at a first end to a conductive row wire and at a second end to a conductive column wire.

8. The semiconductor structure of claim 7, wherein a half select voltage applied at one of the conductive row wire and the conductive column wire is less than a threshold voltage of the access device, wherein the threshold voltage of the access device is less than a sensing voltage of the crosspoint device, wherein the sensing voltage of the crosspoint device is less than a switching threshold of the conductive bridge random access memory device, and wherein the switching threshold of the conductive bridge random access memory device is less than a full select voltage comprising a coincident application of the half select voltage applied at both of the conductive row wire and the conductive column wire.

9. An integrated circuit, comprising:
a crossbar array structure comprising a plurality of crosspoint devices each coupled at a first end to one of a plurality of conductive row wires and at a second end to one of a plurality of conductive column wires;
wherein a given one of the plurality of crosspoint devices comprises a vertical stack of a conductive bridge random access memory device and an access device connected in series with the conductive bridge random access memory device, a surface of a mixed ionic-electronic conductor (MIEC) based bi-polar current source element of the access device being disposed adjacent a surface of the conductive bridge random access memory device in the vertical stack, the vertical stack having a sidewall profile where each of the conductive bridge random access memory device and the access device has a width at its top surface that is less than a width at its bottom surface.

10. The integrated circuit of claim 9, wherein the conductive bridge random access memory device is disposed over the access device in the vertical stack.

11. The integrated circuit of claim 9, wherein the conductive bridge random access memory device is disposed below the access device in the vertical stack.

12. The integrated circuit of claim 9, wherein the conductive bridge random access memory device comprises a solid electrolyte disposed vertically between an active electrode and a counter electrode, and wherein: the solid electrolyte comprises at least one of silicon dioxide, silicon germanium, silicon, germanium, copper sulfide, germanium sulfide and germanium selenide; the active electrode comprises at least one of copper and silver; and the counter electrode comprises at least one of tungsten, platinum, nickel, tungsten-titanium, titanium nitride and tantalum nitride.

13. The integrated circuit of claim 9, wherein the MIEC based bi-polar current source element comprises copper germanium sulfide.

14. The integrated circuit of claim 9, wherein a half select voltage applied at a given one of the plurality of conductive row wires coupled at a first end to the given crosspoint device and a given one of the plurality of conductive column wires coupled at a second end to the given crosspoint device is less than a threshold voltage of the access device, wherein the threshold voltage of the access device is less than a sensing voltage of the given crosspoint device, wherein the sensing voltage of the given crosspoint device is less than a switching threshold of the conductive bridge random access memory device, and wherein the switching threshold of the conductive bridge random access memory device is less than a full select voltage comprising a coincident application of the half select voltage applied at both of the given conductive row wire and the given conductive column wire.

15. A method comprising:

forming a vertical stack comprising a conductive bridge random access memory device and an access device connected in series with the conductive bridge random access memory device, a surface of a mixed ionic-electronic conductor (MIEC) based bi-polar current source element of the access device being disposed adjacent a surface of the conductive bridge random access memory device in the vertical stack; and patterning the vertical stack utilizing a subtractive etching process to form a patterned vertical stack having a sidewall profile where each of the conductive bridge random access memory device and the access device has a width at its top surface that is less than a width at its bottom surface.

16. The method of claim 15, wherein the conductive bridge random access memory device is disposed over the access device in the vertical stack.

17. The method of claim 16, wherein forming the vertical stack comprises depositing a first set of layers for the conductive bridge random access memory device and depositing a second set of layers for the access device over the first set of layers, and wherein patterning the vertical stack utilizing the subtractive etching process to form the patterned vertical stack comprises patterning a hard mask over a top of the second set of layers and utilizing a single subtractive etching process to remove portions of the second set of layers and the first set of layers exposed by the patterned hard mask.

18. The method of claim 15, wherein the conductive bridge random access memory device is disposed below the access device in the vertical stack.

19. The method of claim 18, wherein forming the vertical stack comprises depositing a first set of layers for the access device and depositing a second set of layers for the conductive bridge random access memory device over the first set of layers, and wherein patterning the vertical stack utilizing the subtractive etching process to form the patterned vertical stack comprises patterning a hard mask over a top of the second set of layers and a utilizing two or more subtractive etching processes to remove portions of the second set of layers and the first set of layers exposed by the patterned hard mask.

* * * * *